US012810960B2

(12) United States Patent
Jung et al.

(10) Patent No.: US 12,810,960 B2
(45) Date of Patent: Nov. 24, 2026

(54) SEMICONDUCTOR MEMORY DEVICE AND MEMORY SYSTEM INCLUDING THE SAME

(71) Applicant: SAMSUNG ELECTRONICS CO., LTD., Suwon-si (KR)

(72) Inventors: Bok Kwon Jung, Suwon-si (KR); Ki-Hyun Kim, Suwon-si (KR); Min Su Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 19/007,058

(22) Filed: Dec. 31, 2024

(65) Prior Publication Data

US 2025/0273286 A1 Aug. 28, 2025

(30) Foreign Application Priority Data

Feb. 22, 2024 (KR) ........................ 10-2024-0025830

(51) Int. Cl.
*G11C 29/34* (2006.01)
*G11C 29/00* (2006.01)
*G11C 29/44* (2006.01)

(52) U.S. Cl.
CPC .............. *G11C 29/80* (2013.01); *G11C 29/44* (2013.01)

(58) Field of Classification Search
CPC ................................ G11C 29/80; G11C 29/44
See application file for complete search history.

(56) References Cited

U.S. PATENT DOCUMENTS

| | | | | |
|---|---|---|---|---|
| 6,768,685 | B1 * | 7/2004 | Scheuerlein | G11C 29/34 365/201 |
| 8,289,770 | B2 | 10/2012 | Lee et al. | |
| 10,971,243 | B2 | 4/2021 | Busi et al. | |
| 11,367,495 | B2 * | 6/2022 | Amrie Bin Shaari | G11C 29/802 |
| 11,508,453 | B2 * | 11/2022 | Johnson | G06F 11/1048 |
| 2025/0239321 | A1 * | 7/2025 | Ahn | G11C 29/44 |

FOREIGN PATENT DOCUMENTS

| | | | |
|---|---|---|---|
| JP | 8-102184 | A | 4/1996 |
| JP | 11-102598 | A | 4/1999 |
| JP | 2008-84370 | A | 4/2008 |
| KR | 10-2015-0088018 | A | 7/2015 |
| KR | 10-2022-0060378 | A | 5/2022 |

* cited by examiner

*Primary Examiner* — Min Huang
(74) *Attorney, Agent, or Firm* — Sughrue Mion, PLLC

(57) ABSTRACT

A semiconductor memory device includes a memory cell array including a first memory cell group, a first parallel bit test circuit configured to output a first fail signal based on each of the plurality of memory cells included in the first memory cell group being defective, and output a first pass signal based on at least one memory cell among the plurality of memory cells included in the first memory cell group being not defective, and a first latch circuit configured to selectively latch an output of the first parallel bit test circuit. The first latch circuit is configured to latch the output of the first parallel bit test circuit in response to the first parallel bit test circuit outputting the first pass signal The plurality of memory cells included in the first memory cell group are respective connected to different word lines, and connected to the same bit line.

20 Claims, 20 Drawing Sheets

FIG. 12

| | BL0 | BL1 | BL2 | BL3 | Data Out |
|---|---|---|---|---|---|
| WL0 | P | P | P | P | Pass |
| WL1 | P | F | P | F | Pass |
| WL2 | P | P | P | P | Pass |
| WL3 | F | F | F | F | Fail |

FIG. 14

| | WL0 | WL1 | WL2 | WL3 | Data Out |
|---|---|---|---|---|---|
| BL0 | P | P | P | P | Pass |
| BL1 | P | F | P | F | Pass |
| BL2 | P | P | P | P | Pass |
| BL3 | F | F | F | F | Fail |

SEMICONDUCTOR MEMORY DEVICE AND MEMORY SYSTEM INCLUDING THE SAME

CROSS-REFERENCE TO RELATED APPLICATION

This application claims priority from Korean Patent Application No. 10-2024-0025830, filed on Feb. 22, 2024 in the Korean Intellectual Property Office, and all the benefits accruing therefrom under 35 U.S.C. 119, the contents of which in its entirety are herein incorporated by reference.

BACKGROUND

1. Technical Field

One or more example embodiments of the disclosure relate to a semiconductor memory device and a memory system including the same.

2. Description of the Related Art

Semiconductor memory devices may be divided into non-volatile memory devices such as a flash memory and a volatile memory devices such as a dynamic random access memory (DRAM). The volatile memory devices such as a DRAM may be used to store a large amount of data such as a system memory due to their relatively low price. A memory cell array of a DRAM may include a plurality of word lines and a plurality of bit lines, and a memory cell may be formed at a point where the word line and the bit line intersect.

As a DRAM becomes higher in capacity, a built-in parallel bit test inside a DRAM may be performed to reduce test time. Depending on the parallel bit test, it is possible to determine whether each DRAM memory cell is defective, but when a single bit defect increases, the yield of a DRAM chip production may decrease. Accordingly, a non-single bit defect determination method is needed that exclude a single bit defect and determines a word line or a bit line as defective only when a plurality of memory cells connected to the corresponding word line or the corresponding bit line are all determined to be defective.

SUMMARY

One or more example embodiments of the disclosure provide a semiconductor memory device in which a non-single bit defect may be screened.

One or more example embodiments of the disclosure provide a memory system capable of screening a non-single bit defect of a semiconductor memory device.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of an example embodiment of the present disclosure, there is a provided semiconductor memory device including: a memory cell array including a first memory cell group; a first parallel bit test circuit configured to determine whether each of a plurality of memory cells included in the first memory cell group is defective, configured to output a first fail signal based on each of the plurality of memory cells included in the first memory cell group being defective, and configured to output a first pass signal based on at least one memory cell among the plurality of memory cells included in the first memory cell group being not defective; and a first latch circuit configured to selectively latch an output of the first parallel bit test circuit, wherein the first latch circuit is configured to latch the output of the first parallel bit test circuit in response to the first parallel bit test circuit outputting the first pass signal, wherein the plurality of memory cells included in the first memory cell group are each connected to different word lines, and wherein the plurality of memory cells included in the first memory cell group are respectively connected to a same bit line.

According to an aspect of an example embodiment of the present disclosure, there is a provided semiconductor memory device including: a memory cell array including a memory cell group, a parallel bit test circuit configured to determine whether each of a plurality of memory cells included in the memory cell group is defective, output a fail signal based on each of the plurality of memory cells included in the memory cell group being defective, and output a pass signal based on at least one memory cell among the plurality of memory cells included in the memory cell group being not defective, and a latch circuit configured to selectively latch an output of the parallel bit test circuit, wherein the latch circuit is configured to latch the output of the parallel bit test circuit in response to the parallel bit test circuit outputting the pass signal, wherein the plurality of memory cells included in the memory cell group are respectively connected to different bit lines, and wherein the plurality of memory cells included in the memory cell group are connected to a same word line.

According to an aspect of an example embodiment of the present disclosure, there is a provided memory system including: a semiconductor memory device, a test device configured to test the semiconductor memory device, and a memory controller configured to control an operation of the semiconductor memory device, wherein the semiconductor memory device includes a memory cell array including a plurality of memory cells; a parallel bit test circuit configured to determine whether each of the plurality of memory cells is defective, configured to output a fail signal based on each of the plurality of memory cells being defective, and configured to output a pass signal based on at least one memory cell among the plurality of memory cells being not defective; and a latch circuit configured to selectively latch an output of the parallel bit test circuit, wherein the latch circuit is configured to latch the output of the parallel bit test circuit in response to the parallel bit test circuit outputting the pass signal, wherein the plurality of memory cells are respectively connected to different word lines, and wherein the plurality of memory cells is connected to a same bit line.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which:

FIGS. 11 and 12 are diagrams for describing an operation of a semiconductor memory device according to some example embodiments.

FIGS. 13 and 14 are diagrams for describing an operation of a semiconductor memory device according to some other example embodiments.

DETAILED DESCRIPTION

Hereinafter, a semiconductor memory device and a memory system including the same according to some example embodiments will be described with reference to the accompanying drawings.

Figure 1:
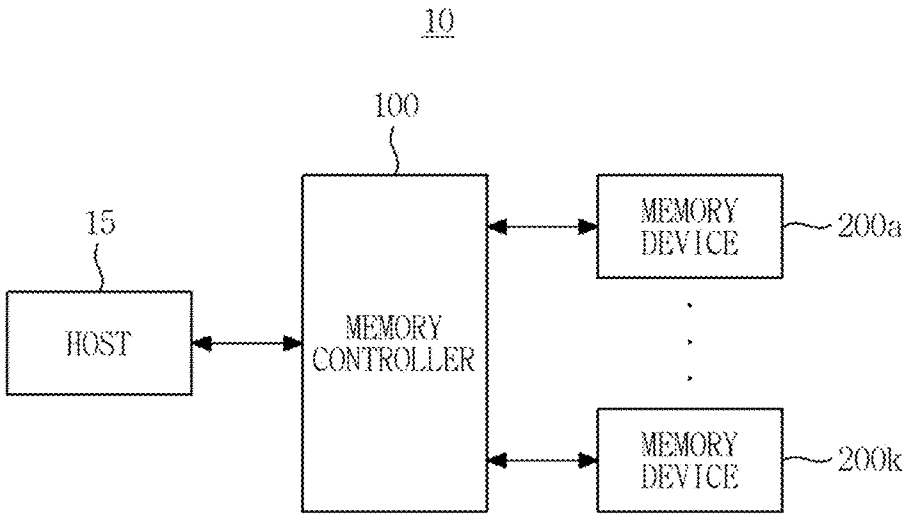
FIG. 1 is a diagram illustrating a memory system according to some example embodiments.

FIG. 1 is a diagram illustrating a memory system according to some example embodiments.

Referring to FIG. 1, a memory system 10 may include a host 15, a memory controller 100, and a plurality of memory devices 200*a* to 200*k*.

The host 15 may communicate with the memory controller 100 and/or the plurality of semiconductor memory devices 200*a* to 200*k* using interface protocols such as, for example, Peripheral Component Interconnect-Express (PCI-E), Advanced Technology Attachment (ATA), Serial ATA (SATA), Parallel ATA (PATA), or serial attached SCSI (SAS). In addition, the interface protocols between the host 15 and the memory controller 100 and/or the plurality of semiconductor memory devices 200*a* to 200*k* are not limited to the examples described above, and may be one of other interface protocols such as, for example, Universal Serial Bus (USB), Multi-Media Card (MMC), Enhanced Small Disk Interface (ESDI), or Integrated Drive Electronics (IDE).

The memory controller 100 may generally control an operation of the plurality of semiconductor memory devices 200*a* to 200*k*, and may control overall data exchange between the host 15 and the semiconductor memory devices 200*a* to 200*k*. For example, the memory controller 100 may control the semiconductor memory devices 200*a* to 200*k* according to a request from the host 15 to write data or read data.

In addition, the memory controller 100 may control the operation of the semiconductor memory devices 200*a* to 200*k* by applying operation commands for controlling the semiconductor memory devices 200*a* to 200*k*.

Depending on the example embodiment, each of the semiconductor memory devices 200*a* to 200*k* may be a volatile memory such as a dynamic random access memory (DRAM) having dynamic memory cells. However, the example embodiment is not limited thereto, and each of the semiconductor memory devices 200*a* to 200*k* may be, for example, a Phase change Random Access Memory (PRAM), a Resistive Random Access Memory (RRAM), a Magnetic Random Access Memory (MRAM), and/or a Ferroelectric Random Access Memory (FRAM) including resistive memory cells, and may be a non-volatile memory such as a flash memory. In the following description, a case where each of the semiconductor memory devices 200*a* to 200*k* is implemented with a DRAM will be described as an example.

Figure 2:
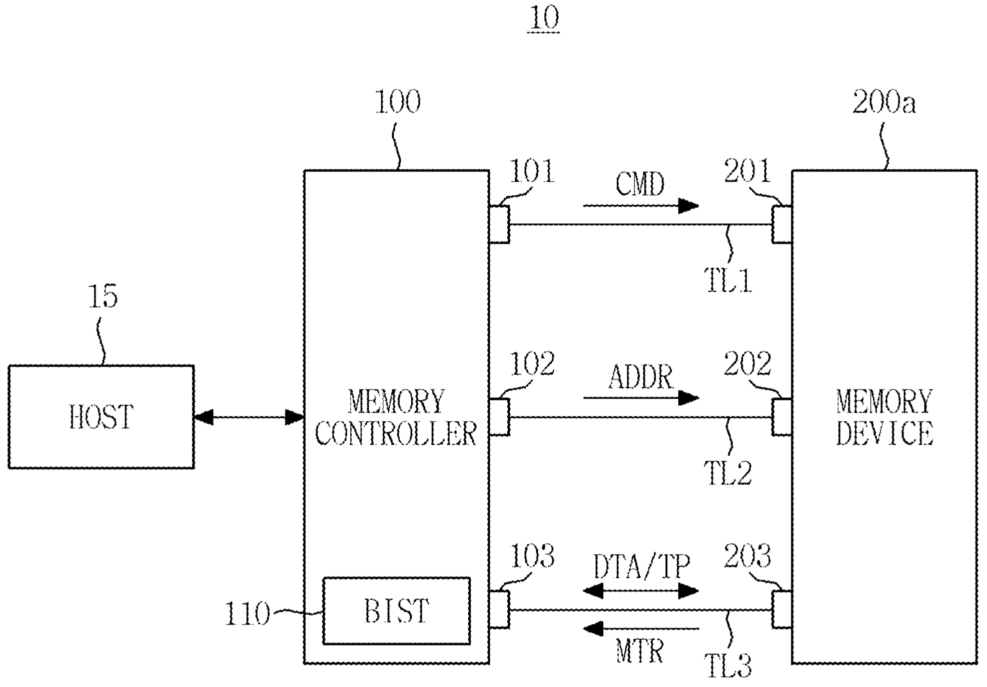
FIG. 2 is a diagram illustrating a schematic configuration of a memory system according to some example embodiments.

FIG. 2 is a diagram illustrating a schematic configuration of the memory system according to some example embodiments.

In FIG. 2, only one semiconductor memory device 200*a* corresponding to the memory controller 100 in the memory system 10 of FIG. 1 will be described as an example. However, the following description may be applied to any one of semiconductor memory devices 200*b* to 200*k* included in the memory system 10 of FIG. 1.

Referring to FIG. 2, the memory controller 100 and the semiconductor memory device 200*a* may be connected to each other through corresponding command pins 101 and 201 and address pins 102 and 202, respectively. The command pins 101 and 201 may be used to transmit and/or receive a command signal CMD through a command transmission line TL1, and the address pins 102 and 202 may be used to transmit and/or receive an address signal ADDR through an address transmission line TL2.

The memory system 10 may operate in any one of a normal mode and a test mode. When the memory system 10 operates in the normal mode, the memory controller 100 may write main data DTA to the semiconductor memory device 200*a*. In this case, the main data DTA may be data that the host 15 has requested to be written to the semiconductor memory device 200*a*.

When the memory system 10 operates in the test mode, the host 15 may be implemented as a test device to test the semiconductor memory device 200*a*. In this case, the memory controller 100 may test the semiconductor memory device 200*a* by writing test pattern data TP to the semiconductor memory device 200*a* according to a request from the host 15 implemented as the test device, and then reading the data written to the semiconductor memory device 200*a*.

The memory controller 100 and the semiconductor memory device 200*a* may be connected to each other through corresponding data pins 103 and 203, respectively. The data pins 103 and 203 may be used to transmit and/or receive the main data DTA in the normal mode through a data transmission line TL3. In addition, the data pins 103 and 203 may be used to provide the test pattern data TP to the semiconductor memory device 200*a* in the test mode, and may provide test result data MTR to the memory controller 100. To this end, the memory controller 100 may include a built-in self test (BIST) 110 that generates the test pattern data TP and receives the test result data MTR in the test mode.

Figure 3:
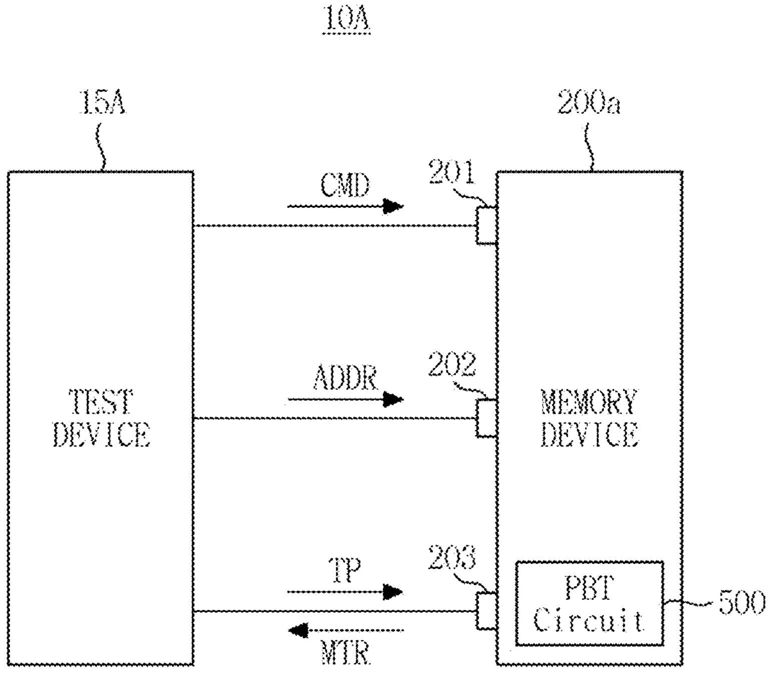
FIG. 3 is a diagram illustrating a schematic configuration of a memory system according to some example embodiments.

FIG. 3 is a diagram illustrating a schematic configuration of a memory system according to some example embodiments.

A memory system 10A of FIG. 3 may correspond to the memory system 10 of FIGS. 1 and 2, and FIG. 3 is a diagram illustrating a state in which the host 15 of FIGS. 1 and 2 is implemented as a test device 15A and the memory system 10A operates in the test mode state.

Referring to FIG. 3, the test device 15A may apply a command CMD indicating the test mode to the semiconductor memory device 200*a* through the command pin 201 in the test mode, and may apply an address ADDR to be tested to the semiconductor memory device 200*a* through the address pin 202. In addition, the test device 15A may apply the test pattern data TP to the semiconductor memory device 200*a* and receive the test result data MTR from the semiconductor memory device 200*a*, through the data pin 203.

The semiconductor memory device 200*a* may include a parallel bit test (PBT) circuit 500. The parallel bit test circuit 500 may perform a parallel bit test operation. Here, the parallel bit test operation may include a test operation to determine whether the semiconductor memory device 200*a* is defective or non-defective by writing the test pattern data TP to memory cells of the semiconductor memory device 200*a* and then comparing data read from the memory cells.

Figure 4:
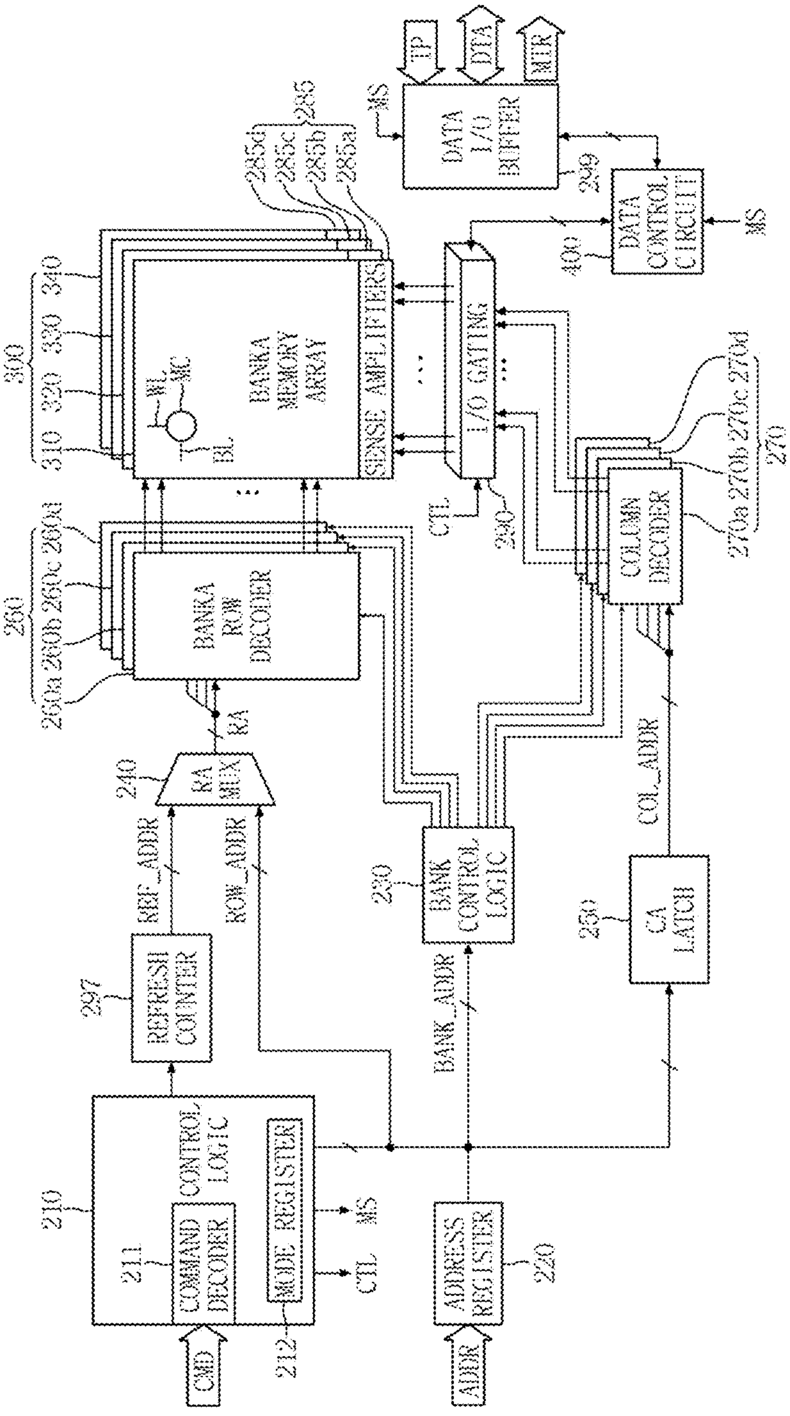
FIG. 4 is a diagram illustrating a configuration of a semiconductor memory device illustrated in FIGS. 1 to 3.

FIG. 4 is a diagram illustrating a configuration of the semiconductor memory device illustrated in FIGS. 1 to 3.

Referring to FIG. 4, the semiconductor memory device 200*a* may include a control logic 210, an address register 220, a bank control logic 230, a refresh counter 297, a row address multiplexer 240, a column address latch 250, a row decoder 260, a column decoder 270, a memory cell array 300, a sense amplifier 285, an input/output gating circuit 290, a data control circuit 400, and a data input/output buffer 299.

The memory cell array 300 may include first to fourth bank arrays 310, 320, 330, and 340. In addition, the row decoder 260 may include first to fourth bank row decoders 260*a*, 260*b*, 260*c*, and 260*d* respectively connected to the first to fourth bank arrays 310 to 340, and the column decoder 270 may include first to fourth bank column decoders 270*a*, 270*b*, 270*c*, and 270*d* respectively connected to the first to fourth bank arrays 310 to 340. The sense amplifier 285 may include first to fourth bank sense amplifiers 285*a*, 285*b*, 285*c*, and 285*d* respectively connected to the first to fourth bank arrays 310 to 340. The first to fourth bank arrays 310 to 340, the first to fourth bank sense amplifiers 285*a* to 285*d*, the first to fourth bank column decoders 270*a* to 270*d*, and the first to fourth bank row decoders 260*a* to 260*d* may respectively configure first to fourth banks.

Each of the first to fourth bank arrays 310 to 340 may include a plurality of word lines WL, a plurality of bit lines BL, and a plurality of memory cells MC formed at points where the plurality of word lines WL and the plurality of bit lines BL intersect. FIG. 4 illustrates an example of the semiconductor memory device 200*a* including four banks, but depending on the example embodiment, the semiconductor memory device 200*a* may include any number of banks.

The address register 220 may receive an address ADDR including a bank address BANK_ADDR, a row address ROW_ADDR, and a column address COL_ADDR from the memory controller 100 (illustrated in FIG. 1). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. In response to the bank control signals, a bank row decoder corresponding to the bank address BANK_ADDR among the first to fourth bank row decoders 260*a* to 260*d* may be activated, and a bank column decoder corresponding to the bank address BANK_ADDR among the first to fourth bank column decoders 270*a* to 270*d* may be activated.

The refresh counter 297 may generate a refresh row address REF_ADDR for refreshing memory cell rows included in the memory cell array 300 under control from the control logic 210.

The row address multiplexer 240 may receive a row address ROW_ADDR from the address register 220, and receive a refresh row address REF_ADDR from the refresh counter 297. The row address multiplexer 240 may selectively output the row address ROW_ADDR or the refresh row address REF_ADDR as a row address RA. The row address RA output from the row address multiplexer 240 may be applied to the first to fourth bank row decoders 260*a* to 260*d*, respectively.

The bank row decoder activated by the bank control logic 230 among the first to fourth bank row decoders 260*a* to 260*d* may decode the row address RA output from the row address multiplexer 240 and activate a word line corresponding to the row address. For example, the activated bank row decoder may apply a word line driving voltage to the word line corresponding to the row address RA.

The column address latch 250 may receive a column address COL_ADDR from the address register 220 and temporarily store the received column address COL_ADDR. In addition, the column address latch 250 may gradually increase the received column address COL_ADDR in a burst mode. The column address latch 250 may apply the temporarily stored or gradually increased column address COL_ADDR to the first to fourth bank column decoders 270*a* to 270*d*, respectively.

The bank column decoder activated by the bank control logic 230 among the first to fourth bank column decoders 270*a* to 270*d* may activate sense amplifiers corresponding to the bank address BANK_ADDR and the column address COL_ADDR through the input/output gating circuit 290.

The input/output gating circuit 290 may include an input data mask logic, read data latches for storing data output from the first to fourth bank arrays 310 to 340, write drivers for writing data to the first to fourth bank arrays 310 to 340, and switching circuits that gate input and output data.

Data to be read from one bank array of the first to fourth bank arrays 310 to 340 may be sensed by a sense amplifier corresponding to the one bank array, and may be stored in the read data latches. The data stored in the read data latches may be provided to the memory controller 100 through the data control circuit 400 and the data input/output buffer 299. Data DTA to be written into one of the first to fourth bank arrays 310 to 340 may be provided from the memory controller 100 to the data input/output buffer 299. The data DTA provided to the data input/output buffer 299 may be written to the memory cell array 300 through the data control circuit 400 and the input/output gating circuit 290.

In the test mode, the data input/output buffer 299 may receive test pattern data TP provided from the outside and provide the test pattern data TP to the input/output gating circuit 290 through the data control circuit 400. In the test mode, the input/output gating circuit 290 may write the test pattern data TP to a target page of the memory cell array 300, read the test pattern data TP from the target page, and provide the read test pattern data TP as test result data to the data control circuit 400.

In the test mode, the data control circuit 400 may sequentially read the test result data from each of the plurality of memory cells. The data control circuit 400 may include a parallel bit test circuit 500. The parallel bit test circuit 500 may determine whether bits of the test result data are identical by sequentially comparing the bits of the read test result data. The parallel bit test circuit 500 may determine whether each of the plurality of memory cells fails (i.e., defective) or passes (i.e., non-defective) based on the determination result.

The data control circuit 400 may output merged test result data MTR based on whether each of the plurality of memory cells fails or passes, as determined by the parallel bit test circuit 500. For example, only when each of the plurality of memory cells connected to one word line or one bit line is a fail, the data control circuit 400 may determine that the entirety of the corresponding word line or the corresponding bit line is defective. As such, the data control circuit 400 may determine the merged result data MTR by determining whether one word line or one bit line (i.e., Non-Single Bit) connected to the plurality of memory cells is defective, rather than whether one memory cell (i.e., Single Bit) is defective. Thereafter, the data control circuit 400 may provide the test result data MTR to the memory controller 100 or the test device 15A (illustrated in FIG. 3) through the data input/output buffer 299.

The control logic 210 may control an operation of the semiconductor memory device 200*a*. For example, the control logic 210 may generate control signals such that the semiconductor memory device 200*a* performs a write operation or a read operation. The control logic 210 may include a command decoder 211 for decoding the command CMD received from the memory controller 100 and a mode register 212 for setting the operation mode of the semiconductor memory device 200*a*.

For example, the command decoder 211 may generate control signals corresponding to the command CMD by decoding a write enable signal/WE, a row address strobe signal/RAS, a column address strobe signal/CAS, and/or a chip select signal/CS. In particular, the control logic 210 may generate a mode signal MS indicating the operation mode of the semiconductor memory device 200*a* and a control signal CTL for controlling the input/output gating circuit 290, by decoding the command CMD. The control logic 210 may provide the mode signal MS to the data input/output buffer 299 and the data control circuit 400.

Figure 5:
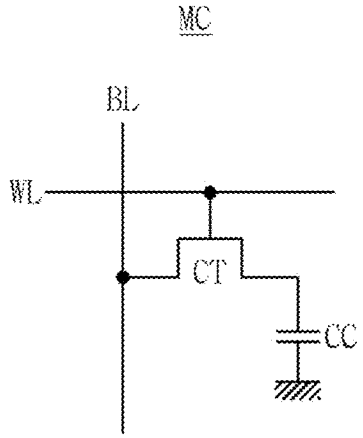
FIG. 5 is a diagram illustrating an example of a memory cell in the semiconductor memory device of FIG. 4.

FIG. 5 is a diagram illustrating an example of a memory cell in the semiconductor memory device of FIG. 4.

Referring to FIG. 5, the memory cell MC may include a cell capacitor CC and a transistor CT. The transistor CT may be a selection element that connects or blocks the cell capacitor CC to or from the bit line BL depending on a voltage of the word line WL. The transistor CT may be connected between the cell capacitor CC and the word line WL and the bit line BL, and the cell capacitor CC may be connected between the transistor CT and a plate voltage.

Figure 6:
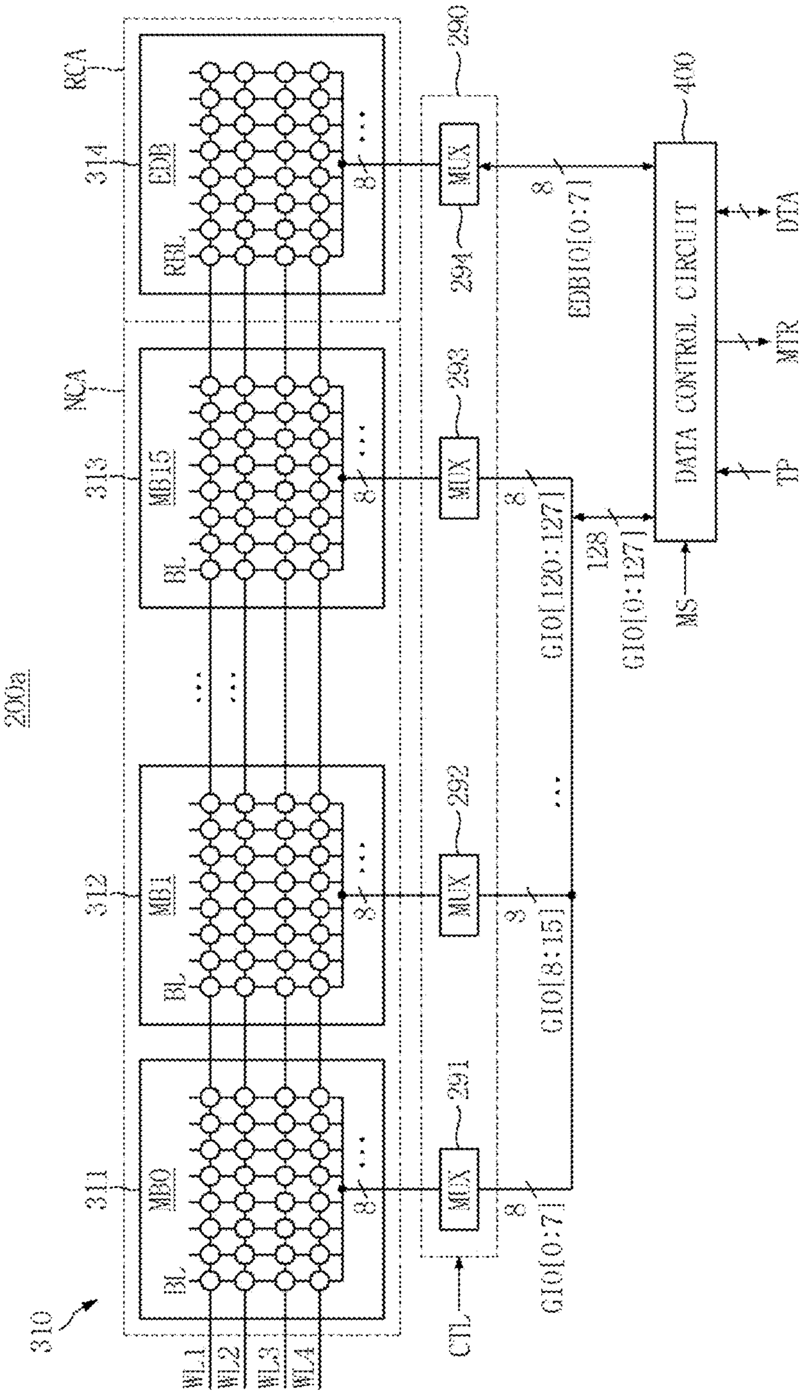
FIG. 6 is an example diagram illustrating a portion of the semiconductor memory device of FIG. 4.

FIG. 6 is an example diagram illustrating a portion of the semiconductor memory device of FIG. 4.

In FIG. 6, the first bank array 310, the input/output gating circuit 290, and the data control circuit 400 are illustrated. In FIG. 6, only the first bank array 310 among the first to fourth bank arrays 310 to 340 included in the memory cell array 300 of FIG. 4 is illustrated, but the same description may be applied to the second to fourth bank arrays 320 to 340.

Referring to FIG. 6, the first bank array 310 may include a normal cell array NCA and a redundancy cell array RCA. The normal cell array NCA may include a plurality of first memory blocks MB0 to MB15, 311, 312, and 313, and the redundancy cell array RCA may include at least one second memory block 314. The first memory blocks 311, 312, and 313 may be blocks that determine a memory capacity of the semiconductor memory device 200*a*. The second memory block 314 may be a redundancy repair block. For example, when memory cells included in the first memory blocks 311, 312, and 313 are determined to be defective, the memory cells may be repaired by replacing the memory cells determined to be defective using memory cells included in the second memory block 314. Memory cells that are not repaired even by using the redundancy repair block may ultimately be determined to be defective.

Each of the first memory blocks 311, 312, and 313 may include a plurality of first memory cells arranged in rows and columns, and the second memory block 314 may also include a plurality of second memory cells arranged in rows and columns.

The rows of each of the first memory blocks 311, 312, and 313 may include, for example, 8K word lines WL, and the columns thereof may include, for example, 1K bit lines BL. In some example embodiments, memory cells connected to the intersections of the word lines WL and the bit lines BL may be configured as dynamic memory cells. In FIG. 6, word lines WL1 to WL4 among the 8K word lines WL are illustrated for convenience of explanation.

The input/output gating circuit 290 may include a plurality of switching circuits 291 to 294 respectively connected to the first memory blocks 311, 312, and 313 and the second memory block 294. In the semiconductor memory device 200*a*, bit lines BL corresponding to a burst length may be accessed simultaneously to support the burst length indicating the maximum number of accessible column locations. For example, the burst length of the semiconductor memory device 200*a* may be set to 8. Accordingly, the bit lines BL may be each connected to a column selection unit connected to each of 128 column selection signals, and 8 bit lines BL may be selected simultaneously by one column selection unit.

The data control circuit 400 may be connected to the switching circuits 291 to 294 through each of the corresponding first data lines GIO[0:127] and second data lines EDBIO[0:7]. The data control circuit 400 may sequentially read test pattern data stored in each of the plurality of memory cells of the first memory blocks 311, 312, and 313 as test result data in the test mode in response to the mode signal MS. Thereafter, the data control circuit 400 may determine whether the test result data is identical by sequentially comparing bits of the read test result data. Thereafter, based on comparison, the data control circuit 400 may output merged test result data MTR indicating whether one word line itself (or one bit line itself) is defective, that is, whether a non-single bit is defective.

The data control circuit 400 may write the data DTA received from the memory controller 100 (illustrated in FIG. 1) to a target page of the first memory blocks 311, 312, and 313 in a write operation of the normal mode, and may read the data DTA from the target page of the first memory blocks

311, 312, and 313 in a read operation of the normal mode. The data control circuit 400 may write the test pattern data TP received from the memory controller 100 or the test device 15A (illustrated in FIG. 3) to the target page of the first memory blocks 311, 312, and 313 in a write operation of the test mode, may read test result data from each of the target pages of the first memory blocks 311, 312, and 313 in a read operation of the test mode, may determine whether the test result data is identical by sequentially comparing bits of the test result data read from each of the target pages of the first memory blocks 311, 312, and 313, and based on comparison, may output the merged test result data MTR indicating whether the non-single bit is defective.

Figure 7:
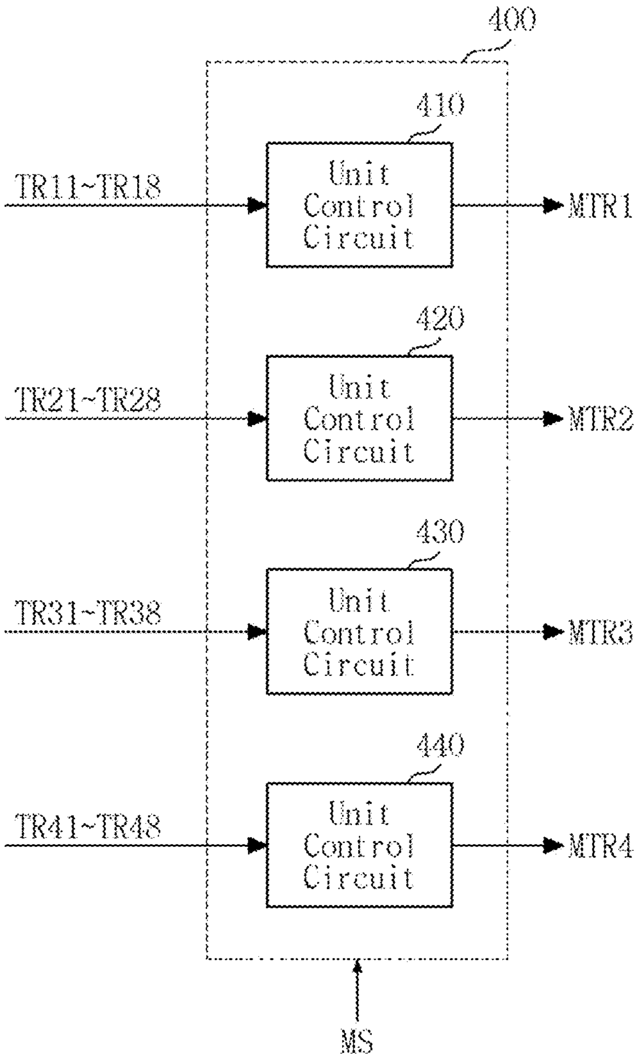
FIG. 7 is a diagram illustrating a data control circuit of FIG. 6 according to some example embodiments.

FIG. 7 is a diagram illustrating the data control circuit of FIG. 6 according to some example embodiments. Hereinafter, an operation of the data control circuit will be described with reference to FIGS. 6 and 7.

It is assumed that test result data TR11 to TR18 are read from the first memory cells of the first memory block 311 connected to the word line WL1 illustrated in FIG. 6, test result data TR21 to TR28 are read from the first memory cells of the first memory block 311 connected to the word line WL2, test result data TR31 to TR38 are read from the first memory cells of the first memory block 311 connected to the word line WL3, and test result data TR41 to TR48 are read from the first memory cells of the first memory block 311 connected to the word line WLA.

However, a direction in which the test pattern data stored in each memory cell of the first memory block 311 is read as the test result data is not limited to the word line WL direction. Therefore, in another example embodiment, the test pattern data stored in the first memory cells of the first memory block 311 may be read as the test result data in the bit line BL direction. An example embodiment in which the test pattern data stored in the first memory cells of the first memory block 311 is read in the bit line BL direction will be described later with reference to FIG. 13.

The data control circuit 400 may include a plurality of unit control circuits 410 to 440. The unit control circuits 410 to 440 may sequentially compare each of the input bits TR11 to TR18, TR21 to TR28, TR31 to TR38, and TR41 to TR48 in response to the mode signal MS, respectively, and may output merged test result data MTR1 to MTR4, respectively, based on the comparison results.

Figure 8:
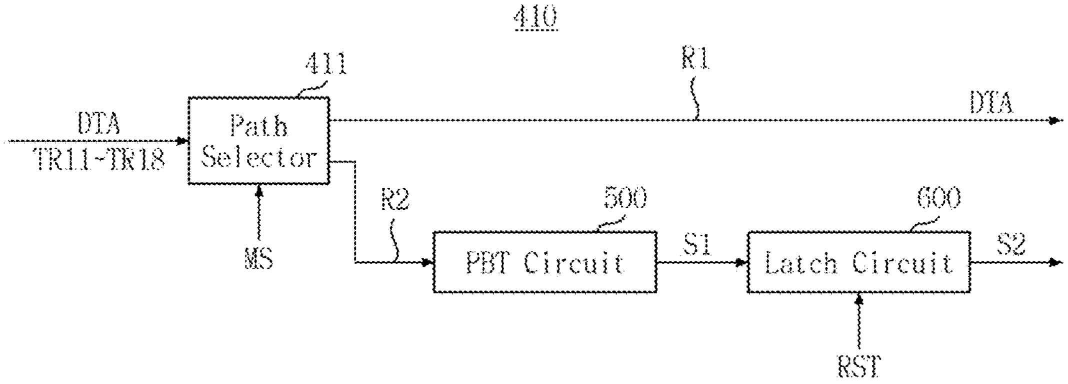
FIG. 8 is a diagram illustrating a configuration of one of unit control circuits in the data control circuit of FIG. 7.

FIG. 8 is a diagram illustrating a configuration of one of the unit control circuits in the data control circuit of FIG. 7.

Although the configuration of the unit control circuit 410 is illustrated in FIG. 8, the configuration of each of the unit control circuits 420 to 440 may also be substantially the same as the configuration of the unit control circuit 410.

Referring to FIG. 8, the unit control circuit 410 may include a path selector 411, a parallel bit test circuit 500, and a latch circuit 600.

In response to the mode signal MS, the path selector 411 may provide the data DTA read from the plurality of memory cells to the data input/output buffer 299 (illustrated in FIG. 4) through a first path R1 in normal mode. In addition, in the test mode, the path selector 411 may provide the input bits TR11 to TR18 corresponding to the test result data to the parallel bit test circuit 500 through a second path R2.

The parallel bit test circuit 500 may include an exclusive OR (XOR) or exclusive NOR (XNOR) logic circuit. The parallel bit test circuit 500 may write the same test pattern data to the plurality of memory cells and then perform a comparison operation through the XOR or XNOR logic circuit when reading the test pattern data as the test result data. The parallel bit test circuit 500 may output a signal S1 as a result of the comparison operation.

The parallel bit test circuit 500 may determine whether each of the plurality of memory cells is defective and output the determination result as the signal S1. Based on the test result data TR11 to TR18, the parallel bit test circuit 500 may output the signal S1 of a logic low level when it is determined that each of the plurality of memory cells passes, and may output the signal S1 of a logic high level when it is determined that each of the plurality of memory cells is failed.

The latch circuit 600 may perform a latch operation in response to a reset signal RST and the signal S1 received from the parallel bit test circuit 500. The latch circuit 600 may selectively latch the output S1 of the parallel bit test circuit 500. For example, the latch circuit 600 may latch the output of the parallel bit test circuit 500 only when the signal S1 output from the parallel bit test circuit 500 is at a logic low level indicating a pass determination, and may not latch the output of the parallel bit test circuit 500 when the signal S1 output from the parallel bit test circuit 500 is at a logic high level indicating a fail determination.

In FIG. 8, the unit control circuit 410 in the read operation is described. The unit control circuit 410 may provide the data DTA to the target page of the first memory blocks 311, 312, and 313 (illustrated in FIG. 6) in a write operation in the normal mode, and may provide the test pattern data TP to the target page of the first memory blocks 311, 312, and 313 in a write operation in the test mode.

Figure 9:
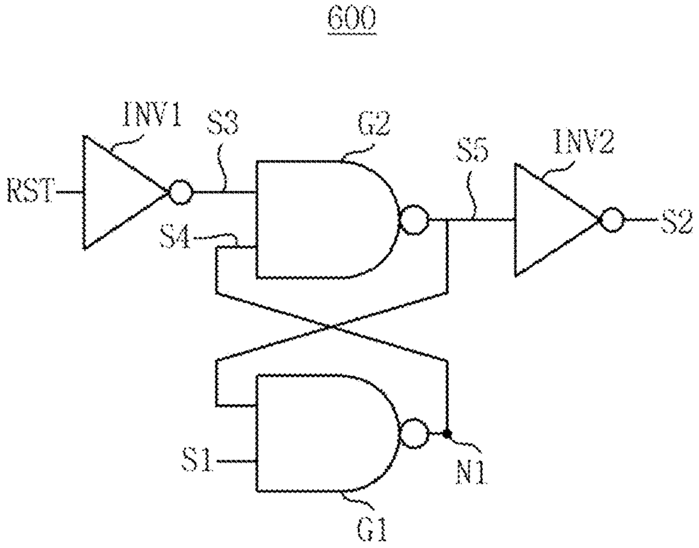
FIG. 9 is an example diagram illustrating a latch circuit of FIG. 7.

FIG. 9 is an example diagram illustrating the latch circuit of FIG. 7.

Referring to FIG. 9, the latch circuit 600 may be based on a Set-Reset (SR) latch. The latch circuit 600 may include an inverter INV1, a logic gate G1, a logic gate G2, and an inverter INV2. The inverter INV1 may output a signal S3 by inverting the reset signal RST. The signal S3 may be input to the logic gate G2. A signal S4 of a node N1 may be input to the logic gate G2. The logic gate G2 may perform a NAND operation on the signals S3 and S4 and output a signal S5. The output S1 of the parallel bit test circuit 500 and the output signal S5 of the logic gate G2 may be input to the logic gate G1. In this way, the logic gates G1 and G2 may be cross-coupled to form the SR latch. The signal S5 output from the logic gate G2 may be input to the inverter INV2, and the inverter INV2 may output a signal S2 by inverting the signal S5.

When the parallel bit test circuit 500 makes a pass determination for a specific memory cell, the signal S1 input to the logic gate G1 may be at a logic low level. In addition, when the reset signal RST input to the inverter INV1 is at a logic low level, the inverter INV1 may output a signal S3 of a logic high level. In this case, the signal S5 output from the logic gate G2 may be at a logic low level. The inverter INV2 may output the signal S2 of the logic high level inverting the signal S5 of the logic low level. In this way, the latch circuit 600 may latch the output S1 of the parallel bit test circuit 500 when the output of the parallel bit test circuit 500 corresponds to the pass determination.

When the parallel bit test circuit 500 makes a fail determination, the signal S1 input to the logic gate G1 may be at a logic high level. When the reset signal RST input to the inverter INV1 is at a logic low level, the inverter INV1 may output a signal S3 of a logic high level. In this case, the logic level of the signal S5 output from the logic gate G2 maintains a previous state.

In another example embodiment, when the parallel bit test circuit 500 makes a fail determination for a specific memory cell such that the signal S1 input to the logic gate G1 is at a logic high level and the reset signal RST input to the inverter INV1 is at a logic high level, the inverter INV1 may output a signal S3 of a logic low level. In this case, the signal S5 output from the logic gate G2 may be at a logic high level. The inverter INV2 may output the signal S2 of the logic low level inverting the signal S5 of the logic high level. In this way, the latch circuit 600 may not latch the output S1 of the parallel bit test circuit 500 when the output of the parallel bit test circuit 500 corresponds to the fail determination.

In this way, once the signal S1 indicating the pass determination for a specific memory cell is input from the parallel bit test circuit 500 to the latch circuit 600, the latch circuit 600 may maintain the state of outputting the signal S2 of the logic high level until the latch circuit 600 is reset, even if the signal S1 indicating the fail determination for a memory cell other than the specific memory cell is input from the parallel bit test circuit 500.

Figure 10:
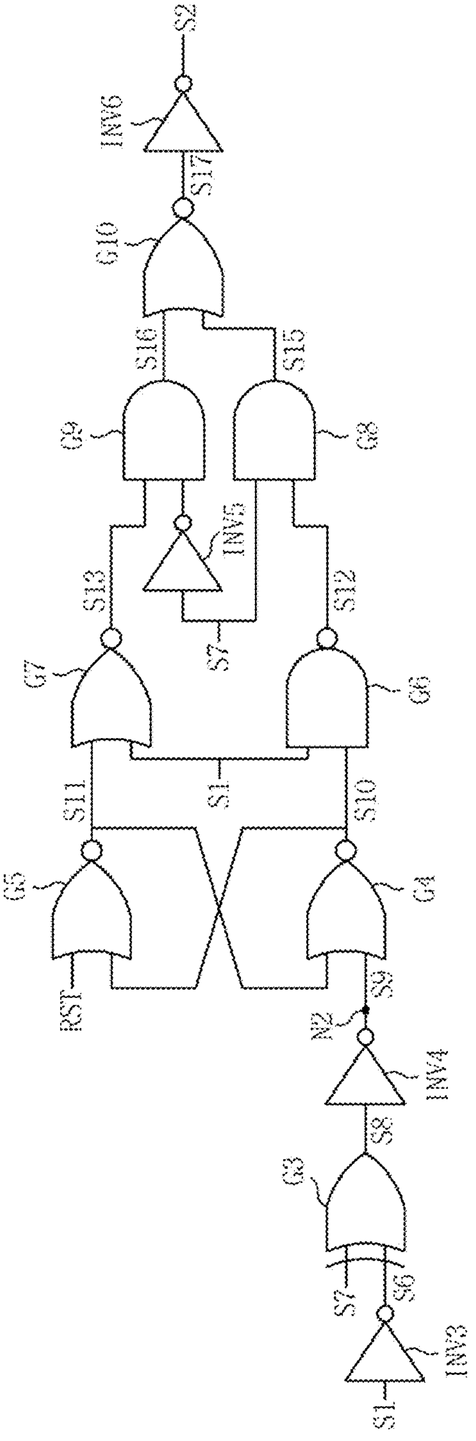
FIG. 10 is an example diagram of a latch circuit according to some other example embodiments.

FIG. 10 is an example diagram of a latch circuit according to some other example embodiments.

Referring to FIG. 10, a latch circuit 600A may be based on a Set-Reset (SR) latch. The latch circuit 600A may include inverters INV3, INV4, INV5, and INV6 and logic gates G3 to G10. The inverter INV3 may output a signal S6 by inverting the signal S1. In this case, the signal S1 may be a signal output from the parallel bit test circuit 500 and may be a signal indicating whether a pass or fail determination is made for each of the memory cells. The logic gate G3 may perform an exclusive OR operation on the signal S6 and a signal S7 and output a signal S8. In this case, the signal S8 may always be at a logic high level. The inverter INV4 may output a signal S9 by inverting the signal S8 output from the logic gate G3. The signal S9 of a node N2 may be at a logic high level when the signal S1 output from the parallel bit test circuit 500 is at a logic low level (i.e., when a pass determination is made for the memory cell). In contrast, the signal S9 of the node N2 may be at a logic low level when the signal S1 output from the parallel bit test circuit 500 is at a logic high level (i.e., when a fail determination is made for the memory cell).

A reset signal RST and an output signal S10 of the logic gate G4 may be input to the logic gate G5. The logic gate G5 may perform a NOR operation on the reset signal RST and the signal S10 and output a signal S11. The logic gate G4 may perform a NOR operation on the signal S9 of the node N2 and the output signal S11 of the logic gate G5 and output the signal S10. In this way, the logic gates G4 and G5 may be cross-coupled to form the SR latch.

The logic gate G6 may perform a NAND operation on the output signal S1 of the parallel bit test circuit 500 and the signal S10 and output a signal S12. The logic gate G7 may perform a NOR operation on the output signal S1 of the parallel bit test circuit 500 and the signal S11 and output a signal S13. The inverter INV5 may output a signal S14 of a logic low level by inverting the signal S7 of a logic high level, the logic gate G8 may perform an AND operation on the signal S12 and the signal S7 of the logic high level and output a signal S15, and the logic gate G9 may perform an AND operation on the signal S14 of the logic low level and the signal S13 and output a signal S16. The logic gate G10 may perform a NOR operation on the signal S15 and the signal S16 and output a signal S17, and the inverter INV6 may output the signal S2 by inverting the signal S17.

When the parallel bit test circuit 500 makes a pass determination for a specific memory cell, the signal S9 of the node N2 may be at a logic high level. In addition, when the reset signal RST input to the logic gate G5 is at a logic low level, the logic gate G5 may output a signal S11 of a logic high level, and the logic gate G4 may output the signal S10 of a logic low level. In addition, the logic gate G7 may perform a NOR operation on the signal S1 of the logic low level and the signal S11 of the logic high level and output the signal S13 of a logic low level. The logic gate G6 may perform a NAND operation on the signal S1 of the logic low level and the signal S10 of the logic low level and output the signal S12 of a logic high level. Thereafter, the logic gate G8 may perform an AND operation on the signal S7 of the logic high level and the signal S12 of the logic high level and output the signal S15 of a logic high level, and the logic gate G9 may perform an AND operation on the signal S14 of the logic low level and the signal S13 of the logic low level and output the signal S16 of a logic low level. Thereafter, the logic gate G10 may perform a NOR operation on the signal S15 of the logic high level and the signal S16 of the logic low level and output a signal S17 of a logic low level, and the inverter INV6 may output the signal S2 of a logic high level by inverting the signal S17 of the logic low level. In this way, the latch circuit 600A may latch the output S1 of the parallel bit test circuit 500 when the output of the parallel bit test circuit 500 corresponds to the pass determination.

In contrast, when the parallel bit test circuit 500 makes a fail determination for a specific memory cell (i.e., when the signal S9 of the node N2 is at a logic low level), and the reset signal RST input to the logic gate G5 is at a logic low level, the logic level of the signal S2 output by the inverter INV6 maintains a previous state. In addition, when the parallel bit test circuit 500 makes a fail determination for a specific memory cell (i.e., when the signal S9 of the node N2 is at a logic low level), and the reset signal RST input to the logic gate G5 is at a logic high level, the inverter INV6 may output the signal S2 of the logic low level. In this way, the latch circuit 600A may not latch the output S1 of the parallel bit test circuit 500 when the output of the parallel bit test circuit 500 corresponds to the fail determination.

Figure 11:
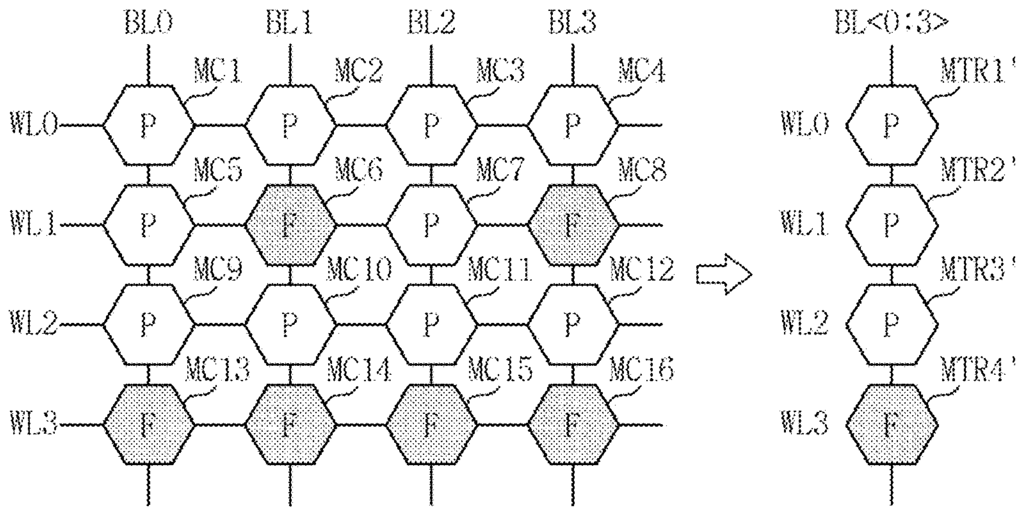

FIGS. 11 and 12 are diagrams for describing an operation of a semiconductor memory device according to some example embodiments.

FIG. 11 is a diagram illustrating a portion of the memory cell array 300 (illustrated in FIG. 4) of the semiconductor memory device 200*a* (illustrated in FIG. 4). For convenience of explanation, only the word lines WL0 to WL3 and the bit lines BL0 to BL3 among the plurality of word lines and bit lines of the memory cell array 300 are illustrated in FIGS. 11 and 12. Memory cells MC1 to MC16 connected to the intersections of the word lines WL0 to WL3 and the bit lines BL0 to BL3 may be configured as dynamic memory cells. After the same data (i.e., test pattern data TP) is written to N (a natural number of 2 or more) memory cells in a parallel bit test mode of the parallel bit test circuit 500, N-bits of data may be simultaneously read. The read N-bits of data may be compared with each other through a comparator included in the parallel bit test circuit 500 to determine whether it is a pass (or "match") or fail (or "mismatch"). Depending on such pass (P)/fail (F), "1"/"0" may be output as test result data.

In some example embodiments, the parallel bit test mode of the parallel bit test circuit 500 may be performed on a word line basis. For example, when determining whether one word line (i.e., Non-Single Bit) to which the plurality of memory cells are connected is defective, rather than determining whether one memory cell (i.e., Single Bit) is defective, defects in the word line may be determined by outputting merged test result data MTR for the plurality of memory cells connected to one word line.

For example, as illustrated in FIGS. 11 and 12, when there are a plurality of memory cells MC1 to MC16 connected to the word lines WL0 to WLA and the bit lines BL0 to BL4, respectively, the parallel bit test circuit 500 may determine whether each of the plurality of memory cells MC1 to MC16 is pass or fail and output test result data. In this case, when a pass determination is made for all of the plurality of memory cells MC1 to MC4 connected to the word line WL0, the data control circuit 400 (illustrated in FIG. 4) may output merged test result data MTR1' indicating a pass for the word line WL0. Likewise, when a pass determination is made for all of the plurality of memory cells MC9 to MC12 connected to the word line WL2, the data control circuit 400 may output merged test result data MTR3' indicating a pass for the word line WL3.

On the other hand, when a pass determination is made for at least one of the plurality of memory cells MC5 to MC8 connected to the word line WL1, the data control circuit 400 may output merged test result data MTR2' indicating a pass for the entire corresponding word line WL1. For example, as illustrated in FIGS. 11 and 12, even if a fail determination is made for the memory cell MC6 and the memory cell MC8, a pass determination may be made for the entire corresponding word line WL1 because the pass determination is made for the memory cells MC5 and MC7 connected to the same word line WL1. In addition, when a fail determination is made for all of the plurality of memory cells MC13 to MC16 connected to the word line WL3, the data control circuit 400 may output merged test result data MTR4' indicating a fail for the word line WL3.

As such, when the pass determination is made for even one of the plurality of memory cells connected to the word line, the data control circuit 400 may make the pass determination for the entire corresponding word line. That is, only when the fail determination is made for the plurality of memory cells connected to the word line, the data control circuit 400 may make the fail determination for the entire corresponding word line.

In this way, the data control circuit 400 may determine whether each of the plurality of memory cells connected to one word line is defective using a parallel bit test method, and may determine whether the entire word line is defective using an AND operation method. Through this, it is possible to exclude a single bit defect and determine a non-single bit defect for an entire word line.

Figure 13:
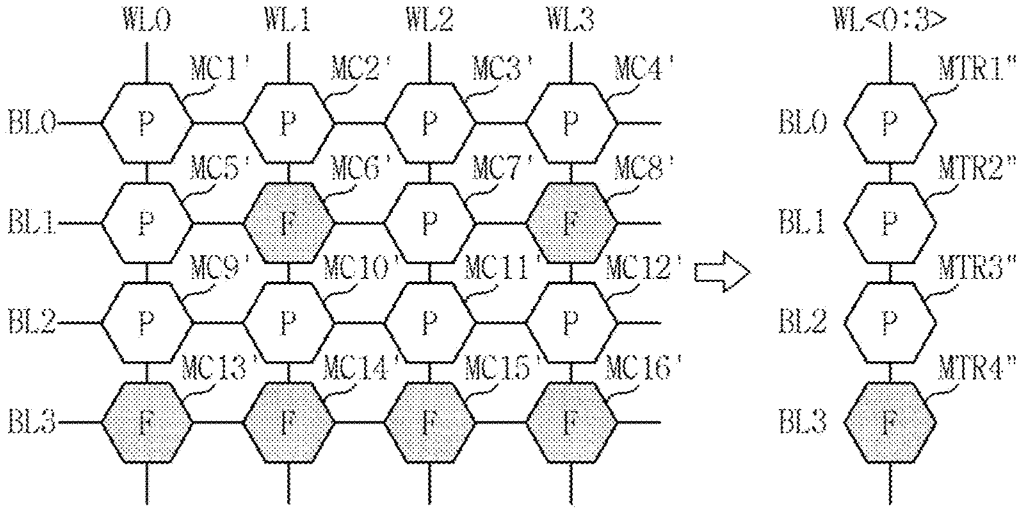

FIGS. 13 and 14 are diagrams for describing an operation of a semiconductor memory device according to some other example embodiments.

Although FIGS. 11 and 12 describe the case where the parallel bit test mode of the parallel bit test circuit 500 is performed on the word line basis, that is, the case where the word line defect of the memory cell array is determined, the example embodiment is not limited thereto.

For example, referring to FIGS. 13 and 14, when a pass determination is made for all of a plurality of memory cells MC1' to MC4' connected to a bit line BL0, the data control circuit 400 may output merged test result data MTR1" indicating a pass for the bit line BL0. Likewise, when a pass determination is made for all of a plurality of memory cells MC9' to MC12' connected to a bit line BL2, the data control circuit 400 may output merged test result data MTR3" indicating a pass to the bit line BL2.

On the other hand, when a pass determination is made for at least one memory cell MC6' and MC8' among a plurality of memory cells MC5' to MC8' connected to the bit line BL1, the data control circuit 400 may output merged test result data MTR2' indicating a pass for the entire corresponding bit line BL1. That is, as illustrated in FIG. 13, even if a fail determination is made for the memory cell MC6' and the memory cell MC8', pass processing may be performed on the entire bit line BL1 because the pass determination was made for the memory cells MC5' and MC8' connected to the same bit line BL1. In addition, when a fail determination is made for all of a plurality of memory cells MC13' to MC16' connected to a bit line BL3, the data control circuit 400 may output merged test result data MTR4' indicating a fail to the bit line BL3.

As such, when the pass determination is made for even one of the plurality of memory cells connected to the bit line, the data control circuit 400 may make the pass determination for the entire corresponding bit line. That is, only when the fail determination is made for all of the plurality of memory cells connected to the bit line, the data control circuit 400 may make the fail determination for the entire corresponding bit line.

In this way, the data control circuit 400 may determine whether each of the plurality of memory cells connected to the bit line is defective using a parallel bit test method, and may determine whether the entire corresponding bit line is defective using an AND operation method. Through this, it is possible to exclude a single bit defect and determine a non-single bit defect for an entire bit line.

FIGS. 11 to 14 describe the case in which the entire word line or the entire bit line is determined to be defective when the fail determination is made for every one of the memory cells connected to the word line or bit line, as an example, but the example embodiment is not limited thereto. In another example embodiment, only memory cells at predetermined addresses among the plurality of memory cells connected to the word line or the bit line may be considered when determining whether or not the word line or the bit line is defective. For example, referring to FIG. 13, only the memory cells MC6' and MC8' corresponding to some of the memory cells MC5' to MC8' connected to the bit line BL1 may be considered when determining whether the entire bit line BL1 is defective. In such a case, even if a pass determination is made for each of the memory cells MC5' and MC7' connected to the bit line BL1, the fail determination may be made for the entire bit line BL1 because the fail determination is made for all of memory cells MC6' and MC8' at predetermined addresses.

In this way, the memory cells at the predetermined addresses that are considered when determining whether the word line or the bit line has a non-single bit defect among the plurality of memory cells connected to the word line or the bit line may form a memory cell group. Hereinafter, the description of determining whether an entirety of a word line or a bit line is defective may include a case of determining whether an entirety of a memory cell group including memory cells at predetermined addresses is defective.

Figure 15:
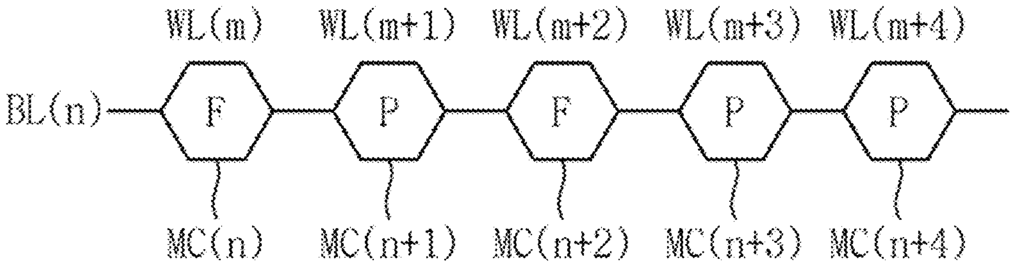
FIG. 15 is a diagram illustrating a bit line that is a subject of a parallel bit test according to some example embodiments.
Figure 16:
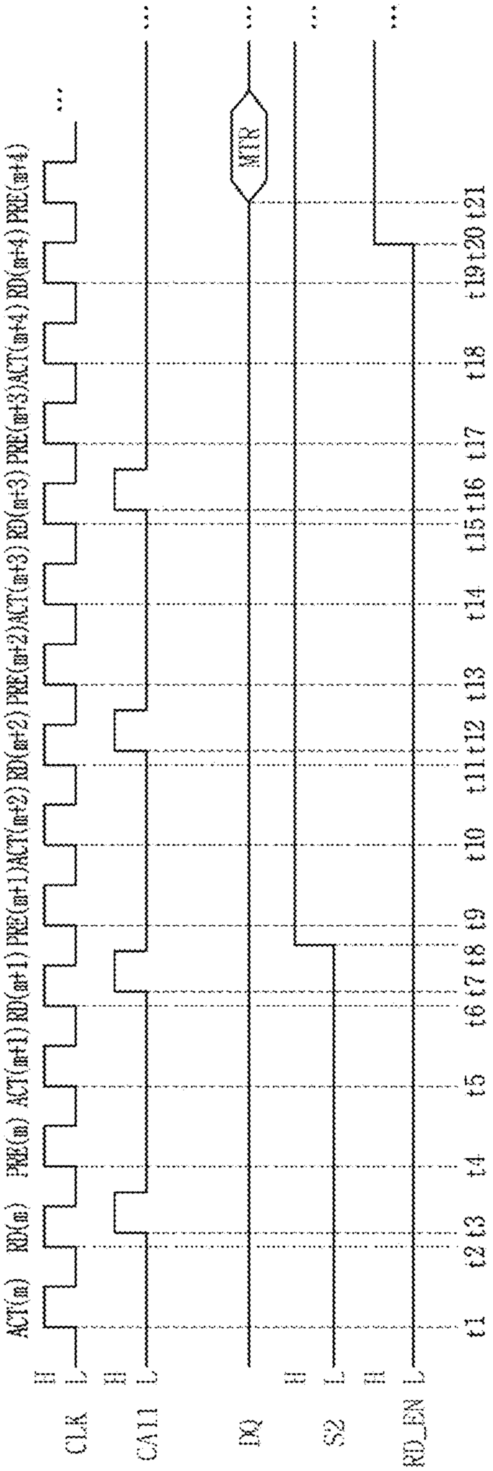
FIG. 16 is a timing diagram illustrating a read operation of test pattern data stored in a memory cell of FIG. 15 according to some example embodiments.

FIG. 15 is a diagram illustrating a bit line that is a subject of a parallel bit test according to some example embodiments. FIG. 16 is a timing diagram illustrating a read operation of test pattern data stored in the memory cell of FIG. 15 according to some example embodiments.

In the following, a case in which test pattern data stored in memory cells MC(n) to MC(n+4) connected to a bit line BL(n) is read will be described as an example with reference to FIGS. 15 and 16 together. The parallel bit test circuit 500 may make a pass or fail determination for each of the memory cells MC(n) to MC(n+4) through a parallel bit test operation. In the following, a case in which the parallel bit test circuit 500 makes a fail determination for the memory cell MC(n) and the memory cell MC(n+2), and makes a pass determination for the memory cell MC(n+1), the memory cell MC(n+3), and the memory cell MC(n+4) will be described as an example.

Referring to FIG. 16, in the test mode, at time point t1, the memory controller 100 (illustrated in FIG. 2) may apply an active command ACT(m) for a word line WL(m) to the semiconductor memory device 200*a* (illustrated in FIG. 2). In response to the active command ACT(m), the word line WL(m) may be activated. After the word line WL(m) is activated, at time point t2, the memory controller 100 may apply a read command RD(m) for the word line WL(m) to the semiconductor memory device 200*a*. In response to the read command RD(m) being applied to the semiconductor memory device 200*a*, a logic level of a command/address signal CA11 applied to the semiconductor memory device 200*a* may transition from a first logic level L to a second logic level H at time point t3. After the command/address signal CA11 applied to the semiconductor memory device 200*a* toggles once, the logic level of the command/address signal CA11 may transition back to the first logic level L.

In response to the read command RD(m) being applied to the semiconductor memory device 200*a*, the parallel bit test circuit 500 (illustrated in FIG. 2) may determine whether the memory cell MC(n) is a pass (i.e., normal) or a fail (i.e., defective) by reading data stored in the memory cell MC(n) connected to the bit line BL(n) and the word line WL(m), and may transmit the signal S1 (illustrated in FIG. 8) indicating the determination result to the latch circuit 600 (illustrated in FIG. 8). The latch circuit 600 may latch the output of the parallel bit test circuit 500 when receiving a pass signal from the parallel bit test circuit 500, and may not latch the output of the parallel bit test circuit 500 when receiving a fail signal from the parallel bit test circuit 500.

When the parallel bit test circuit 500 makes the fail determination for the memory cell MC(n), the latch circuit 600 may output the signal S2 of a logic low level, and in this case, the latch circuit 600 may not latch the output of the parallel bit test circuit 500.

In addition, in response to the read command RD(m) for the word line WL(m) being applied at time point t2, and the command/address signal CA11 of the second logic level H being then applied to the semiconductor memory device 200*a* at time point t3, the data (i.e., data including information about whether the memory cell MC(n) is defective) read from the memory cell MC(n) may not be immediately provided to the test device 15A (illustrated in FIG. 3). Thereafter, at time point t4, the bit line of the memory cell connected to the word line WL(m) may be precharged.

Thereafter, at time point t5, the memory controller 100 may apply an active command ACT(m+1) for a word line WL(m+1) to the semiconductor memory device 200*a*. In response to the active command ACT(m+1), the word line WL(m+1) may be activated. After the word line WL(m+1) is activated, at time point t6, the memory controller 100 may apply a read command RD(m+1) for the word line WL(m+1) to the semiconductor memory device 200*a*. In response to the read command RD(m+1) being applied to the semiconductor memory device 200*a*, a logic level of a command/address signal CA11 applied to the semiconductor memory device 200*a* may transition from the first logic level L to the second logic level H.

In response to the read command RD(m+1) being applied to the semiconductor memory device 200*a*, the parallel bit test circuit 500 may make a pass determination for the memory cell MC(n+1) by reading data stored in the memory cell MC(n+1). Accordingly, the parallel bit test circuit 500 may transmit a pass signal to the latch circuit 600, and the latch circuit 600 may output the signal S2 of a logic high level signal at time point t8. In this case, the latch circuit 600 may latch the output of the parallel bit test circuit 500.

In addition, in response to the read command RD(m+1) for the word line WL(m+1) being applied at time point t6, and the command/address signal CA11 of the second logic level H being then applied to the semiconductor memory device 200*a* at time point t7, the data (i.e., data including information about whether the memory cell MC(n+1) is defective) read from the memory cell MC(n+1) may not be immediately provided to the test device 15A. Thereafter, at time point t9, the bit line of the memory cell connected to the word line WL(m+1) may be precharged.

Thereafter, at time point t10, the memory controller 100 may apply an active command ACT(m+2) for a word line WL(m+2) to the semiconductor memory device 200*a*. In response to the active command ACT(m+2), the word line WL(m+2) may be activated. After the word line WL(m+2) is activated, at time point t11, the memory controller 100 may apply a read command RD(m+2) for the word line WL(m+2) to the semiconductor memory device 200*a*. In response to the read command RD(m+2) being applied to the semiconductor memory device 200*a*, a logic level of a command/address signal CA11 applied to the semiconductor memory device 200*a* may transition from the first logic level L to the second logic level H at time point t12.

In response to the read command RD(m+2) being applied to the semiconductor memory device 200*a*, the parallel bit test circuit 500 may make a fail determination for the memory cell MC(n+2) by reading data stored in the memory cell MC(n+2). Accordingly, the parallel bit test circuit 500 may transmit a fail signal to the latch circuit 600. In this case, as described with reference to FIG. 9, the latch circuit 600 may maintain a state in which the latch circuit 600 outputs the signal S2 of the logic high level even if the latch circuit 600 receives a fail signal from the parallel bit test circuit 500.

In addition, in response to the read command RD(m+2) for the word line WL(m+2) being applied at time point t11, and the command/address signal CA11 of the second logic level H being then applied to the semiconductor memory device 200*a* at time point t12, the data (i.e., data including information about whether the memory cell MC(n+2) is defective) read from the memory cell MC(n+2) may not be immediately provided to the test device 15A. Thereafter, at time point t13, the bit line of the memory cell connected to the word line WL(m+2) may be precharged.

Thereafter, at time point t14, an active command ACT (m+3) for a word line WL(m+3) may be applied to the semiconductor memory device 200*a*, and accordingly, the word line WL(m+3) may be activated. Thereafter, at time point t15, a read command RD(m+3) for the word line WL(m+3) may be applied to the semiconductor memory device 200*a*, and in response, the parallel bit test circuit 500 may make a pass determination for the memory cell MC(n+3) by reading data stored in the memory cell MC(n+3). Accordingly, the parallel bit test circuit 500 may transmit a pass signal to the latch circuit 600, and the latch circuit 600 may continuously output the signal S2 of the logic high level.

In addition, in response to the read command RD(m+3) for the word line WL(m+3) being applied at time point t15, and the command/address signal CA11 of the second logic level H being then applied to the semiconductor memory device 200*a* at time point t16, the data (i.e., data including information about whether the memory cell MC(n+3) is defective) read from the memory cell MC(n+3) may not be immediately provided to the test device 15A. Thereafter, at time point t17, the bit line of the memory cell connected to the word line WL(m+3) may be precharged.

Thereafter, at time point t18, the memory controller 100 may apply an active command ACT(m+4) for a word line WL(m+4) to the semiconductor memory device 200*a*. In response to the active command ACT(m+4), the word line WL(m+4) may be activated. After the word line WL(m+4) is activated, at time point t19, the memory controller 100 may apply a read command RD(m+4) for the word line WL(m+4) to the semiconductor memory device 200*a*.

Even if the read command RD(m+4) is applied to the semiconductor memory device 200*a*, the command/address signal CA11 applied to the semiconductor memory device 200*a* may continue to maintain the first logic level L. In this way, in response to the read command RD(m+4) being applied to the semiconductor memory device 200*a*, but the logic level of the command/address signal CA11 applied to the semiconductor memory device 200*a* being the first logic level L, the memory controller 100 may transmit a read enable signal RD_EN of a logic high level to the semiconductor memory device 200*a*. Accordingly, the logic level of the read enable signal RD_EN applied to the semiconductor memory device 200*a* may transition from the first logic level L to the second logic level H at time point t20.

In this way, in response to the read enable signal RD_EN of the logic high level being applied to the semiconductor memory device 200*a*, merged test result data MTR may be output from the semiconductor memory device 200*a* at time point t21. The merged test result data MTR may include information regarding whether the entire bit line BL(n) is a pass or fail. When a pass determination is made from even one of the memory cells MC(n) to MC(n+4) connected to the bit line BL(n) (i.e., when the signal S2 is at the second logic level H at the time point t20 at which the read enable signal RD_EN of the logic high level is applied to the semiconductor memory device 200*a*), the test result data MTR may include information that the entire bit line BL(n) is a pass.

In another example embodiment, when a fail determination is made for all memory cells MC(n) to MC(n+4) connected to the bit line BL(n), the signal S2 will remain at the first logic level L. In this case, the test result data MTR output from the semiconductor memory device 200*a* may include information that the entire bit line BL(n) is a fail. The test result data MTR output from the semiconductor memory device 200*a* may be transmitted to the test device 15A.

Figure 17:
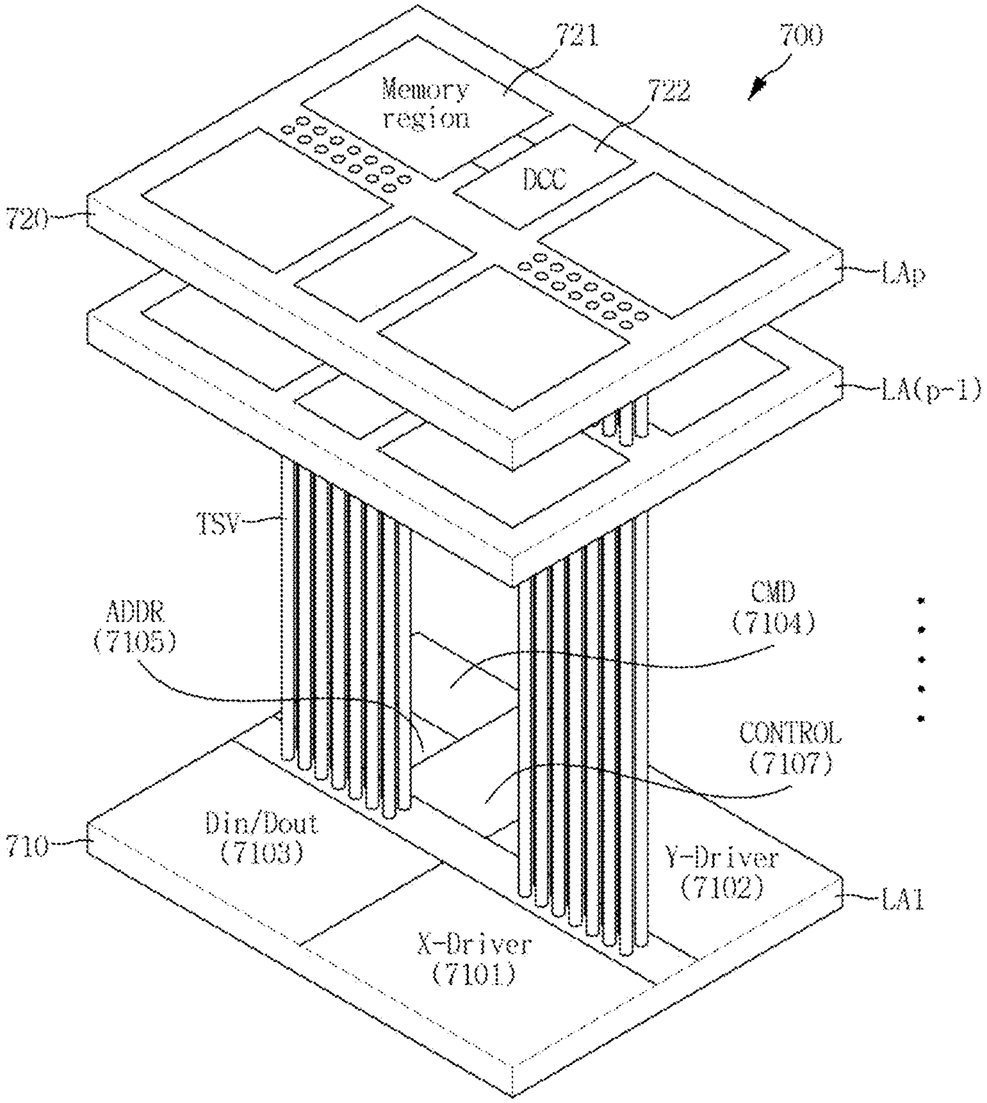
FIG. 17 is a structural diagram illustrating a semiconductor memory device according to some example embodiments.

FIG. 17 is a structural diagram illustrating a semiconductor memory device according to some example embodiments.

As illustrated in FIG. 17, a semiconductor memory device 700 may include multiple semiconductor layers LA1 to Lap (p is a natural number of 3 or more). The lowest semiconductor layer LA1 is assumed to be a master chip, and the remaining semiconductor layers LA2 to LAp are assumed to be slave chips. The semiconductor memory device 200*a* described with reference to FIG. 2 may correspond to any one of the semiconductor layers LA2 to LAp. The multiple semiconductor layers LA1 to LAp may transmit and receive signals to each other through through-silicon vias TSV, and the master chip LA1 may communicate with an external memory controller 100 (illustrated in FIG. 1) through a conductive means formed on an outer surface thereof. The configuration and operation of the semiconductor memory device 700 will be described as follows, using an example of a first semiconductor layer 710 as the master chip and a p-th semiconductor layer 720 as the slave chip.

The first semiconductor layer 710 may include various peripheral circuits for driving a memory region 721 provided in the slave chips. For example, the first semiconductor layer 710 may include a row driver 7101 (X-Driver) for driving the word line of the memory, a column driver 7102 (Y-Driver) for driving the bit line of the memory, a data input/output unit 7103 for controlling data input/output, a command buffer 7104 that receives a command CMD from the outside and buffers the command CMD, and an address buffer 7105 that receives an address from the outside and buffers the address. The memory region may include first memory blocks and second memory blocks, as described with reference to FIG. 6.

In addition, the first semiconductor layer 710 may further include a control logic 7107. The control logic 7107 may control access to the memory region 721 based on the command and address signals provided from the memory controller 100, and may generate control signals for accessing the memory region 721.

The p-th semiconductor layer 720 may include a data control circuit 722 that tests memory cells included in the memory region 721 in the test mode. The data control circuit 722 may correspond to the data control circuit 400 described with reference to FIGS. 4 to 16. As described with reference to FIGS. 4 to 16, the data control circuit 722 may provide the merged test result data MTR indicating whether the entirety of one word line (or one bit line) is a fail to the memory controller 100 or the test device 15A (illustrated in FIG. 3) by sequentially reading the test result data from each of the plurality of memory cells connected to the one word line (or the one bit line) of the memory region 721 in the test mode and sequentially comparing the read test result data. The memory controller 100 or the test device 15A may screen (or identify) a non-single bit defect based on the test result data MTR.

Figure 18:
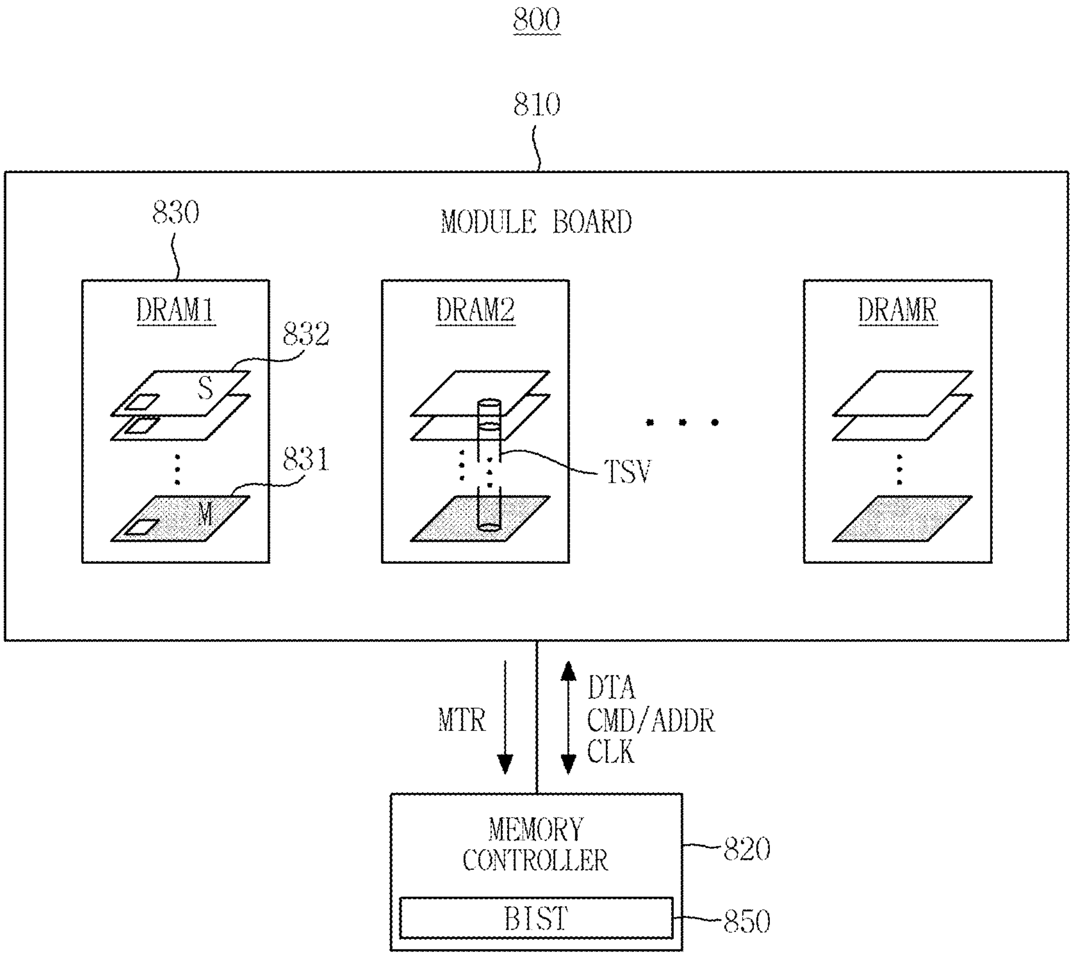
FIG. 18 is a diagram illustrating a memory system to which a semiconductor memory device is applied according to some example embodiments.

FIG. 18 is a diagram illustrating a memory system to which a semiconductor memory device is applied according to some example embodiments.

Referring to FIG. 18, a memory system 800 may include a memory module 810 and a memory controller 820. The memory module 810 may include at least one semiconductor memory device (DRAM) 830 mounted on a module board. The semiconductor memory device 830 may be implemented as the semiconductor memory device 200*a* of FIG. 2. For example, the semiconductor memory device 830 may be implemented as a DRAM chip. In addition, each semiconductor memory device 830 may include a plurality of semiconductor chips stacked on top of each other. In this case, the semiconductor chips may include at least one master chip 831 and at least one slave chip 832. Signal transmission between the semiconductor chips stacked on top of each other may be performed through a through silicon via (TSV).

Each of the master chip 831 and the slave chip 832 may include the semiconductor memory device 200*a* of FIG. 2. Therefore, the semiconductor memory device 830 may provide merged test result data MTR indicating whether one word line (or one bit line) is defective to a built-in test circuit 850 of the memory controller 820 by sequentially reading test result data from each of the plurality of memory cells connected to the one word line (or the one bit line) in the test mode and sequentially comparing the read test result data. The built-in test circuit 850 may screen non-single bit defects based on the merged test result data MTR.

The memory module 810 may communicate with the memory controller 820 through a system bus. Data DTA, commands/addresses CMD/ADDR, clock signals CLK, etc. may be transmitted and received between the memory module 810 and the memory controller 820 through the system bus.

Figure 19:
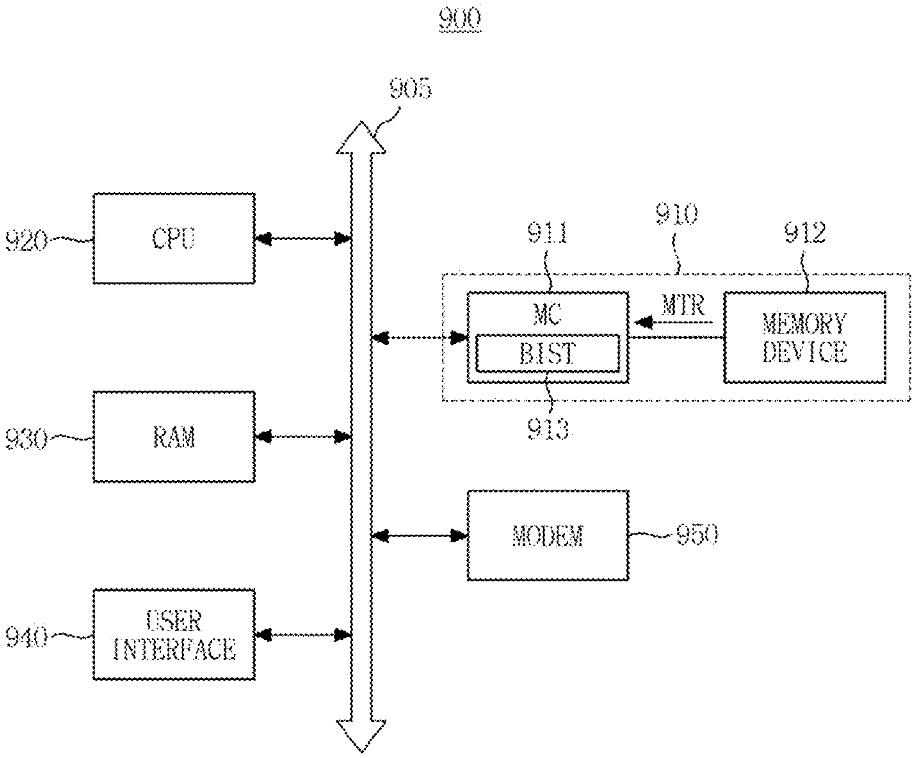
FIG. 19 is a diagram illustrating a computing system equipped with a semiconductor memory device according to some example embodiments.

FIG. 19 is a diagram illustrating a computing system equipped with a semiconductor memory device according to some example embodiments.

Referring to FIG. 19, a computing system 900 may be mounted on a mobile device or a desktop computer. The computing system 900 may include a memory system 910, a central processing unit (CPU) 920, a random access memory (RAM) 930, a user interface 940, and a modem 950 such as a baseband chipset that are electrically connected to a system bus 905. The computing system 900 may further include an application chipset, a camera image processor (CIS), an input/output device, etc.

The user interface 940 may be an interface for transmitting data to and/or receiving data from a communication network. The user interface 940 may be an interface for transmitting data and/to or receiving data from a communication network. The user interface 940 may be in a wired or wireless form and may include an antenna or a wired or wireless transceiver. Data provided through the user interface 940 or the modem 950 or processed by the central processing unit 920 may be stored in the memory system 910.

The memory system 910 may include a semiconductor memory device 912 and a memory controller 911. The memory controller 911 may include a built-in test device 913. The semiconductor memory device 912 stores the data processed by the central processing unit 920 or data input from the outside. The semiconductor memory device 912 may provide merged test result data MTR indicating whether one word line (or one bit line) is defective to the built-in test device 913 of the memory controller 911 by sequentially reading test result data from the plurality of memory cells connected to the one word line (or the one bit line) in the test mode and sequentially comparing the read test result data. The built-in test device 913 may determine whether to repair the memory cells based on the merged test result data MTR.

When the computing system 900 is equipment that performs wireless communication, the computing system 900 may be used in communication systems such as Code Division Multiple Access (CDMA), Global System for Mobile communication (GSM), North American Multiple Access (NADC), and CDMA2000. The computing system 900 may be mounted on an information processing device such as a personal digital assistant (PDA), a portable computer, a web tablet, a digital camera, a portable media player (PMP), a mobile phone, a wireless phone, or a laptop computer.

Figure 20:
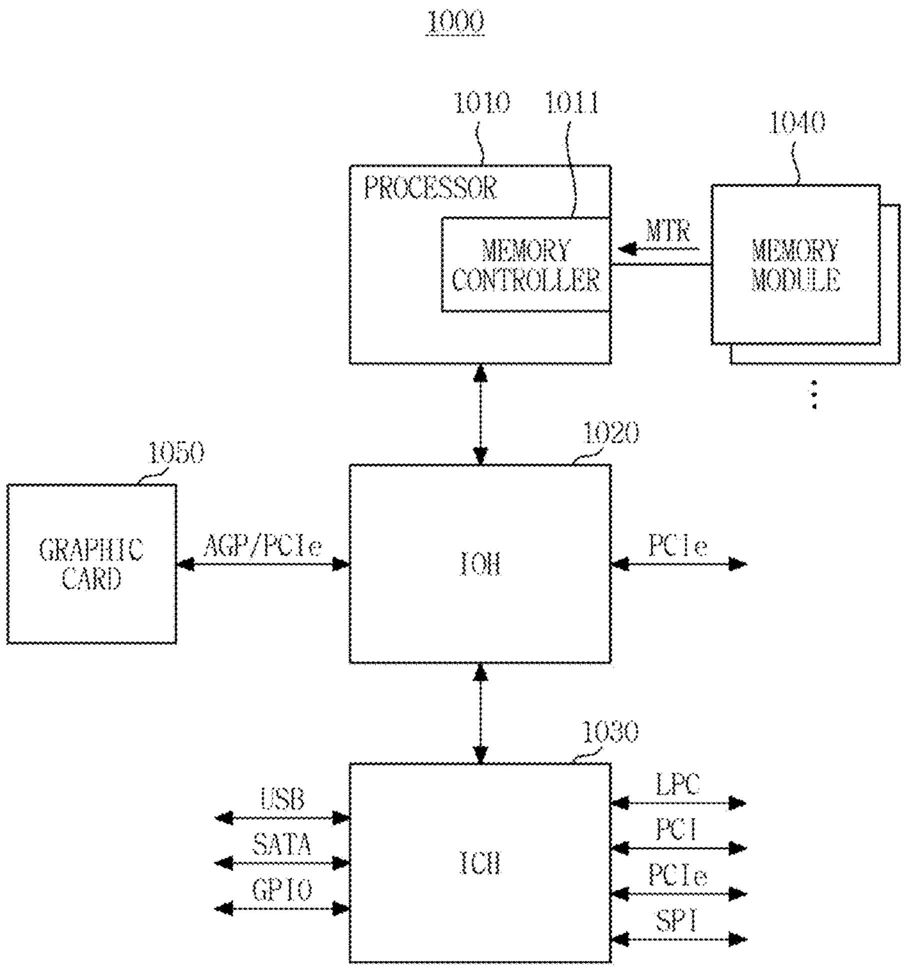
FIG. 20 is a block diagram illustrating an example of applying a semiconductor memory device to a computing system according to some example embodiments.

FIG. 20 is a block diagram illustrating an example of applying a semiconductor memory device to a computing system according to some example embodiments.

Referring to FIG. 20, the computing system 1000 includes a processor 1010, an input/output hub 1020, an input/output controller hub 1030, at least one memory module 1040, and a graphics card 1050. Depending on example embodiments, the computing system 1000 may be any computing system, such as a personal computer (PC), a server computer, a workstation, a laptop, a mobile phone, a smart phone, a personal digital assistant (PDA), a portable multimedia player (PMP), a digital camera, a digital television, a set-top box, a music player, a portable game console, a navigation system, etc.

The processor 1010 may perform various computing functions, such as specific calculations or tasks. For example, processor 1010 may be a microprocessor or a central processing unit (CPU). Depending on the example embodiment, the processor 1010 may include one processor core (Single Core) or a plurality of processor cores (Multi Core). For example, the processor 1010 may include multi-core, such as dual-core, quad-core, or hexa-core. In addition, FIG. 20 illustrates the computing system 1000 including one processor 1010, but depending on the example embodiment, the computing system 1000 may include a plurality of processors. In addition, depending on the example embodiment, the processor 1010 may further include a cache memory located inside or outside. The processor 1010 may include a memory controller 1011 that controls an operation of the memory module 1040. The memory controller 1011 included in the processor 1010 may be called an integrated memory controller (IMC). A memory interface between the memory controller 1011 and the memory module 1040 may be implemented as one channel including a plurality of signal lines, or may be implemented as a plurality of channels. In addition, one or more memory modules 1040 may be connected to each channel. Depending on the example embodiment, the memory controller 1011 may be located within the input/output hub 1020. The input/output hub 1020 including the memory controller 1011 may be called a memory controller hub (MCH).

The memory module 1040 may include a plurality of semiconductor memory devices that store data provided from the memory controller 1011. Each of the semiconductor memory devices may determine whether a test result of each of a plurality of memory cells is a pass or a fail by sequentially reading test result data from the plurality of memory cells connected to one word line (or one bit line) in the test mode and sequentially comparing the read test result data, and may provide merged test result data MTR including information regarding whether the entire one word line (or the entire one bit line) is defective to the memory controller 1011 based on the determination result. The memory controller 1011 may screen a non-single bit defect of the semiconductor memory device based on the merged test result data MTR.

The input/output hub 1020 may manage data transmission between devices such as the graphics card 1050 and the processor 1010. The input/output hub 1020 may be connected to the processor 1010 through various types of interfaces. For example, the input/output hub 1020 and the processor 1010 may be connected through various standards of interfaces such as Front Side Bus (FSB), System Bus, HyperTransport, and Lightning Data Transport (LDT), QuickPath Interconnect (QPI), Common System Interface (CSI), etc. FIG. 20 illustrates the computing system 1000 including one input/output hub 1020, but depending on the example embodiment, the computing system 1000 may include a plurality of input/output hubs.

The input/output hub 1020 may provide various interfaces between devices. For example, the input/output hub 1020 may provide Accelerated Graphics Port (AGP) interface, Peripheral Component Interface-Express (PCIe), Communications Streaming Architecture (CSA) interface, etc.

The graphics card 1050 may be connected to the input/output hub 1020 through AGP or PCIe. The graphics card 1050 may control a display device for displaying images. The graphics card 1050 may include an internal processor and an internal semiconductor memory device for image data processing. Depending on the example embodiment, the input/output hub 1020 may include a graphics device with the graphics card 1050 located outside the input/output hub 1020 or inside the input/output hub 1020 instead of the graphics card 1050. The graphics device included in the input/output hub 1020 may be called integrated graphics. In addition, the input/output hub 1020 including the memory controller and the graphics device may be called a graphics and memory controller hub (GMCH).

The input/output controller hub 1030 may perform data buffering and interface arbitration such that various system interfaces efficiently operate. The input/output controller hub 1030 may be connected to the input/output hub 1020 through an internal bus. For example, the input/output hub 1020 and the input/output controller hub 1030 may be connected through Direct Media Interface (DMI), hub interface, Enterprise Southbridge Interface (ESI), PCIe, etc.

The input/output controller hub 1030 may provide various interfaces with peripheral devices. For example, the input/output controller hub 1030 may provide a Universal Serial Bus (USB) port, a Serial Advanced Technology Attachment (SATA) port, a General Purpose Input/Output (GPIO), a Low Pin Count (LPC) bus, Serial Peripheral Interface (SPI), PCI, PCIe, etc.

While the present disclosure has been particularly illustrated and described with reference to example embodiments thereof, it will be understood by those of ordinary skill in the art that various changes in form and detail may be made therein without departing from the spirit and scope of the present disclosure as defined by the following claims and their equivalents. The example embodiments should be considered in a descriptive sense only and not for purposes of limitation.

What is claimed is:

1. A semiconductor memory device comprising:

a memory cell array including a first memory cell group;

a first parallel bit test circuit configured to determine whether each of a plurality of memory cells included in the first memory cell group is defective, configured to output a first fail signal based on each of the plurality of memory cells included in the first memory cell group being defective, and configured to output a first pass signal based on at least one memory cell among the plurality of memory cells included in the first memory cell group being not defective; and a first latch circuit configured to selectively latch an output of the first parallel bit test circuit, wherein the first latch circuit is configured to latch the output of the first parallel bit test circuit in response to the first parallel bit test circuit outputting the first pass signal, wherein the plurality of memory cells included in the first memory cell group are respectively connected to different word lines, and wherein the plurality of memory cells included in the first memory cell group are connected to a same bit line.

2. The semiconductor memory device of claim 1, wherein the first latch circuit includes:

a first inverter configured to output a first signal by inverting a reset signal;

a first logic gate configured to perform a NAND operation on the first signal and a second signal of a first node, to output a third signal;

a second logic gate configured to output the second signal by performing a NAND operation on the output of the first parallel bit test circuit and the third signal; and a second inverter configured to output a fourth signal by inverting the third signal.

3. The semiconductor memory device of claim 1, wherein the first latch circuit is based on a Set-Reset (SR) latch, and wherein the first latch circuit includes:

a first inverter configured to output a first signal by inverting a reset signal;

a first NAND gate configured to, based on the first signal and a second signal, generate a third signal;

a second NAND gate configured to form the SR latch by being cross-coupled with the first NAND gate and generate the second signal by receiving the output of the first parallel bit test circuit and the third signal; and a second inverter configured to output a fourth signal by inverting the third signal.

4. The semiconductor memory device of claim 1, wherein the memory cell array further includes a second memory cell group, and wherein the semiconductor memory device further comprises:

a second parallel bit test circuit configured to determine whether each of a plurality of memory cells included in the second memory cell group is defective, configured to output a second fail signal based on each of the plurality of memory cells included in the second memory cell group being defective, and configured to output a second pass signal based on at least one memory cell among the plurality of memory cells included in the second memory cell group being not defective; and a second latch circuit configured to selectively latch an output of the second parallel bit test circuit, wherein the second latch circuit is configured to latch the output of the second parallel bit test circuit in response to the second parallel bit test circuit outputting the second pass signal, wherein the plurality of memory cells included in the second memory cell group are respectively connected to different word lines, and wherein the plurality of memory cells included in the second memory cell group are connected to a same bit line.

5. The semiconductor memory device of claim 1, wherein the first latch circuit includes:

a first inverter configured to output a first signal by inverting the output of the first parallel bit test circuit;

a first logic gate configured to perform an XOR operation on the first signal and a second signal, to output a third signal; and a second inverter configured to output a fourth signal by inverting the third signal, wherein the second signal is at a logic high level, and wherein the first latch circuit is based on a set-reset (SR) latch.

6. The semiconductor memory device of claim 5, wherein the first latch circuit further includes:

a second logic gate configured to perform a NOR operation on a reset signal and a fifth signal of a first node, to output a sixth signal;

a third logic gate configured to form the SR latch by being cross-coupled with the second logic gate and output the fifth signal by performing a NOR operation on the fourth signal and the sixth signal;

a fourth logic gate configured to output a seventh signal by performing a NOR operation on the sixth signal and the output of the first parallel bit test circuit;

a fifth logic gate configured to output an eighth signal by performing a NAND operation on the fifth signal and the output of the first parallel bit test circuit;

a third inverter configured to output a ninth signal by inverting the second signal, a sixth logic gate configured to output a tenth signal by performing an AND operation on the seventh signal and the ninth signal;

a seventh logic gate configured to output an eleventh signal by performing an AND operation on the second signal and the eighth signal;

an eighth logic gate configured to output a twelfth signal by performing a NOR operation on the tenth signal and the eleventh signal; and a fourth inverter configured to output a thirteenth signal by inverting the twelfth signal.

7. The semiconductor memory device of claim 1, wherein the first memory cell group includes a first memory cell and a second memory cell, wherein, in response to the first parallel bit test circuit outputting the first fail signal of a first logic level at a first time point as a result of determining whether the first memory cell is defective, the first latch circuit is configured to output a signal of a second logic level different from the first logic level, and wherein, in response to the first parallel bit test circuit outputting the first pass signal of the second logic level at a second time point after the first time point as a result of determining whether the second memory cell is defective, the first latch circuit is configured to output a signal of the first logic level.

8. The semiconductor memory device of claim 7, wherein the first memory cell group further includes a third memory cell, and wherein, in response to the first parallel bit test circuit outputting the first fail signal of the first logic level at a third time point after the second time point as a result of determining whether the third memory cell is defective, the first latch circuit is configured to output the signal of the first logic level.

9. A semiconductor memory device comprising:

a memory cell array including a memory cell group;

a parallel bit test circuit configured to determine whether each of a plurality of memory cells included in the memory cell group is defective, configured to output a fail signal based on each of the plurality of memory cells included in the memory cell group being defective, and configured to output a pass signal based on at least one memory cell among the plurality of memory cells included in the memory cell group being not defective; and a latch circuit configured to selectively latch an output of the parallel bit test circuit, wherein the latch circuit is configured to latch the output of the parallel bit test circuit in response to the parallel bit test circuit outputting the pass signal, wherein the plurality of memory cells included in the memory cell group are respectively connected to different bit lines, and wherein the plurality of memory cells included in the memory cell group are connected to a same word line.

10. The semiconductor memory device of claim 9, wherein the latch circuit includes:

a first inverter configured to output a first signal by inverting a reset signal;

a first logic gate configured to perform a NAND operation on the first signal and a second signal of a first node, to output a third signal;

a second logic gate configured to output the second signal by performing a NAND operation on the output of the parallel bit test circuit and the third signal; and a second inverter configured to output a fourth signal by inverting the third signal.

11. The semiconductor memory device of claim 9, wherein the latch circuit is based on a Set-Reset (SR) latch, and wherein the latch circuit includes:

a first inverter configured to output a first signal by inverting a reset signal;

a first logic gate configured to perform a NAND operation on the first signal and a second signal, to generate a third signal;

a second logic gate configured to form the SR latch by being cross-coupled with the first logic gate and generate the second signal by performing a NAND operation on the output of the parallel bit test circuit and the third signal; and a second inverter configured to output a fourth signal by inverting the third signal.

12. The semiconductor memory device of claim 9, wherein the memory cell group includes a first memory cell connected to a first word line and a first bit line, and a second memory cell connected to the first word line and a second bit line different from the first bit line, wherein, in response to the parallel bit test circuit outputting the fail signal of a first logic level at a first time point as a result of determining whether the first memory cell is defective, the latch circuit is configured to output a signal of a second logic level different from the first logic level, and wherein, in response to the parallel bit test circuit outputting the pass signal of the second logic level at a second time point after the first time point as a result of determining whether the second memory cell is defective, the latch circuit is configured to output the signal of the first logic level.

13. The semiconductor memory device of claim 12, wherein the memory cell group further includes a third memory cell connected to the first word line and a third bit line different from the first bit line and the second bit line, and wherein, in response to the parallel bit test circuit outputting the fail signal of the first logic level at a third time point after the second time point as a result of determining whether the third memory cell is defective, the latch circuit is configured to output the signal of the first logic level.

14. A memory system comprising:

a semiconductor memory device;

a test device configured to test the semiconductor memory device; and a memory controller configured to control an operation of the semiconductor memory device, wherein the semiconductor memory device includes:

a memory cell array including a plurality of memory cells;

a parallel bit test circuit configured to determine whether each of the plurality of memory cells is defective, output a fail signal based on each of the plurality of memory cells being defective, and output a pass signal based on at least one memory cell among the plurality of memory cells being not defective; and a latch circuit configured to selectively latch an output of the parallel bit test circuit, wherein the latch circuit is configured to latch the output of the parallel bit test circuit in response to the parallel bit test circuit outputting the pass signal, wherein the plurality of memory cells are respectively connected to different word lines, and wherein the plurality of memory cells are connected to a same bit line.

15. The semiconductor memory device of claim 14, wherein the memory controller is configured to apply at least one command to control an operation of the semiconductor memory device, wherein the plurality of memory cells include a first memory cell and a second memory cell, the first memory cell being connected to a first word line and a first bit line, the second memory cell being connected to a second word line different from the first word line and the first bit line, wherein, in response to the memory controller applying a first active command for the first word line to the semiconductor memory device, the first word line is activated at a first time point, and wherein, in response to the memory controller, after the first time point, applying a first read command to the semiconductor memory device, a command/address signal of a first logic level is applied to the semiconductor memory device at a second time point after the first time point.

16. The semiconductor memory device of claim 15, wherein, in response to the memory controller, after the second time point, applying a second active command to the semiconductor memory device, the second word line is activated at a third time point after the second time point, and wherein, in response to the memory controller, after the third time point, applying a second read command to the semiconductor memory device, a command/address signal of a second logic level different from the first logic level is applied to the semiconductor memory device at a fourth time point after the third time point.

17. The semiconductor memory device of claim 15, wherein the memory controller is configured to, in response to the command/address signal of the first logic level being applied to the semiconductor memory device at the second time point, not transmit a read enable signal to the semiconductor memory device.

18. The semiconductor memory device of claim 16, wherein the memory controller is configured to, in response to the command/address signal of the second logic level being applied to the semiconductor memory device at the fourth time point, transmit a read enable signal to the semiconductor memory device.

19. The semiconductor memory device of claim 18, wherein the memory controller is configured to, in response to the read enable signal being applied to the semiconductor memory device, transmit data read from the first memory cell and the second memory cell to the test device.

20. The semiconductor memory device of claim 15, wherein the memory controller is configured to, in response to the first read command being applied to the semiconductor memory device and the command/address signal of the first logic level being applied to the semiconductor memory device, not transmit data read from the first memory cell to the test device.

* * * * *